(12) United States Patent
Lee et al.

(10) Patent No.: US 10,644,241 B2
(45) Date of Patent: May 5, 2020

(54) POLYMER AND ORGANIC SOLAR CELL COMPRISING SAME

(71) Applicant: LG CHEM, LTD., Seoul (KR)

(72) Inventors: Jiyoung Lee, Daejeon (KR); Jinseck Kim, Daejeon (KR); Donggu Lee, Daejeon (KR); Jaechol Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 122 days.

(21) Appl. No.: 15/535,600

(22) PCT Filed: Dec. 18, 2015

(86) PCT No.: PCT/KR2015/013984
§ 371 (c)(1),
(2) Date: Oct. 16, 2017

(87) PCT Pub. No.: WO2016/099218
PCT Pub. Date: Jun. 23, 2016

(65) Prior Publication Data
US 2018/0033970 A1    Feb. 1, 2018

(30) Foreign Application Priority Data

Dec. 19, 2014  (KR) .................. 10-2014-0184885

(51) Int. Cl.
*H01L 51/00* (2006.01)
*C08G 75/06* (2006.01)
(Continued)

(52) U.S. Cl.
CPC .......... *H01L 51/0036* (2013.01); *C08G 61/12* (2013.01); *C08G 61/126* (2013.01);
(Continued)

(58) Field of Classification Search
CPC ............. H01L 51/0036; H01L 51/0043; H01L 51/0047; H01L 51/42; H01L 51/4253; C08G 61/126; C08G 61/12; C08G 75/06; C08G 2261/51; C08G 2261/3243; C08G 2261/3223; C08G 2261/312;
(Continued)

(56) References Cited

U.S. PATENT DOCUMENTS 9,184,392 B2   11/2015   Kim et al.
2013/0048075 A1  2/2013  Leclerc et al.
(Continued)

FOREIGN PATENT DOCUMENTS

CN   103249799 A   8/2013
CN   104140521 A   * 11/2014
(Continued)

OTHER PUBLICATIONS

"Bandgap and Molecular Energy Level Control of Conjugated Polymer Photovoltaic Materials Based on Benzo[1,2-b:4,5-b']dithiophene"; Hou, et al.; American Chemical Society; Macromolecules 2008, 41, 6012-6018.
(Continued)

*Primary Examiner* — Michael Y Sun
(74) *Attorney, Agent, or Firm* — Myers Bigel, P.A.

(57) ABSTRACT

The present specification relates to a polymer and an organic solar cell including the same.

17 Claims, 12 Drawing Sheets

(51) Int. Cl.
*C08G 61/12* (2006.01)
*H01L 51/42* (2006.01)

(52) U.S. Cl.
CPC .......... *C08G 75/06* (2013.01); *H01L 51/0043* (2013.01); *H01L 51/0047* (2013.01); *H01L 51/42* (2013.01); *C08G 2261/12* (2013.01); *C08G 2261/122* (2013.01); *C08G 2261/146* (2013.01); *C08G 2261/149* (2013.01); *C08G 2261/1424* (2013.01); *C08G 2261/312* (2013.01); *C08G 2261/3223* (2013.01); *C08G 2261/3243* (2013.01); *C08G 2261/414* (2013.01); *C08G 2261/51* (2013.01); *H01L 51/4253* (2013.01); *Y02E 10/549* (2013.01); *Y02P 70/521* (2015.11)

(58) Field of Classification Search
CPC ........ C08G 2261/146; C08G 2261/122; C08G 2261/12; C08G 2261/1424; C08G 2261/149; C08G 2261/414; Y02P 70/521; Y02E 10/549
See application file for complete search history.

(56) References Cited

U.S. PATENT DOCUMENTS

| | | |
|---|---|---|
| 2013/0167929 A1 | 7/2013 | Wen et al. |
| 2014/0061538 A1* | 3/2014 | Blouin ................. C07D 495/04 252/301.35 |
| 2014/0084220 A1* | 3/2014 | Inagaki ............... H01L 51/0036 252/511 |
| 2016/0155946 A1* | 6/2016 | Blouin ................. C08G 61/126 252/511 |

FOREIGN PATENT DOCUMENTS

| | | | |
|---|---|---|---|
| CN | 104140521 A | | 11/2014 |
| JP | 2013189602 A | * | 9/2013 |
| KR | 10-2013-0090821 A | | 8/2013 |
| KR | 10-2014-0043387 A | | 4/2014 |
| WO | 2012-030942 A1 | | 3/2012 |
| WO | 2012-124627 A1 | | 9/2012 |

OTHER PUBLICATIONS

"New Moderate Bandgap Polymers Containing Alkoxysubstituted-Benzo[c][1,2,5]thiadiazole and Thiophene-Based Units"; Lim, et al.; Journal of Polymer Science Part A: Polymer Chemistry 2011, 49, 4387-4397.

Extended European Search Report corresponding to European Patent Application No. 15870385.0 dated Jul. 13, 2018. (9 pages).

* cited by examiner

[Figure 1]
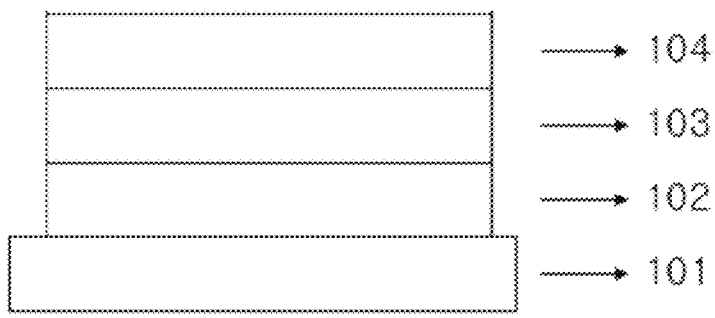
[Figure 2]
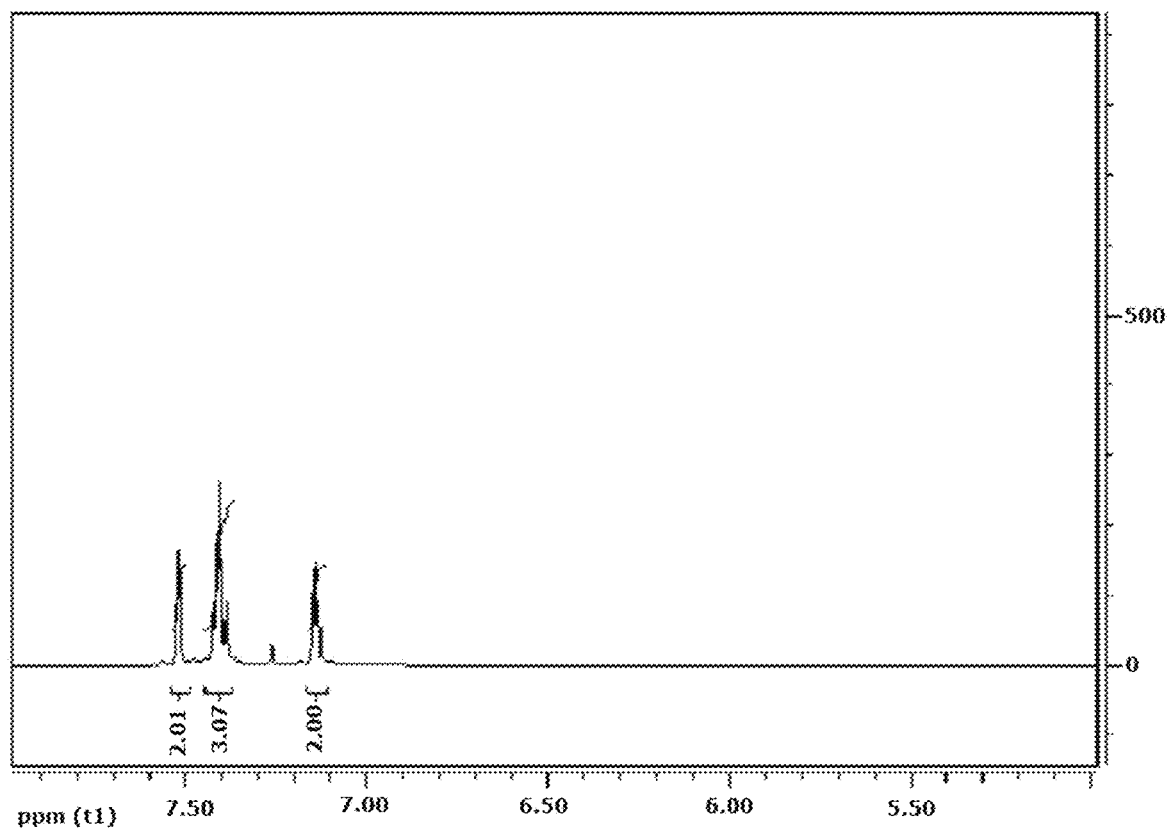

[Figure 3]
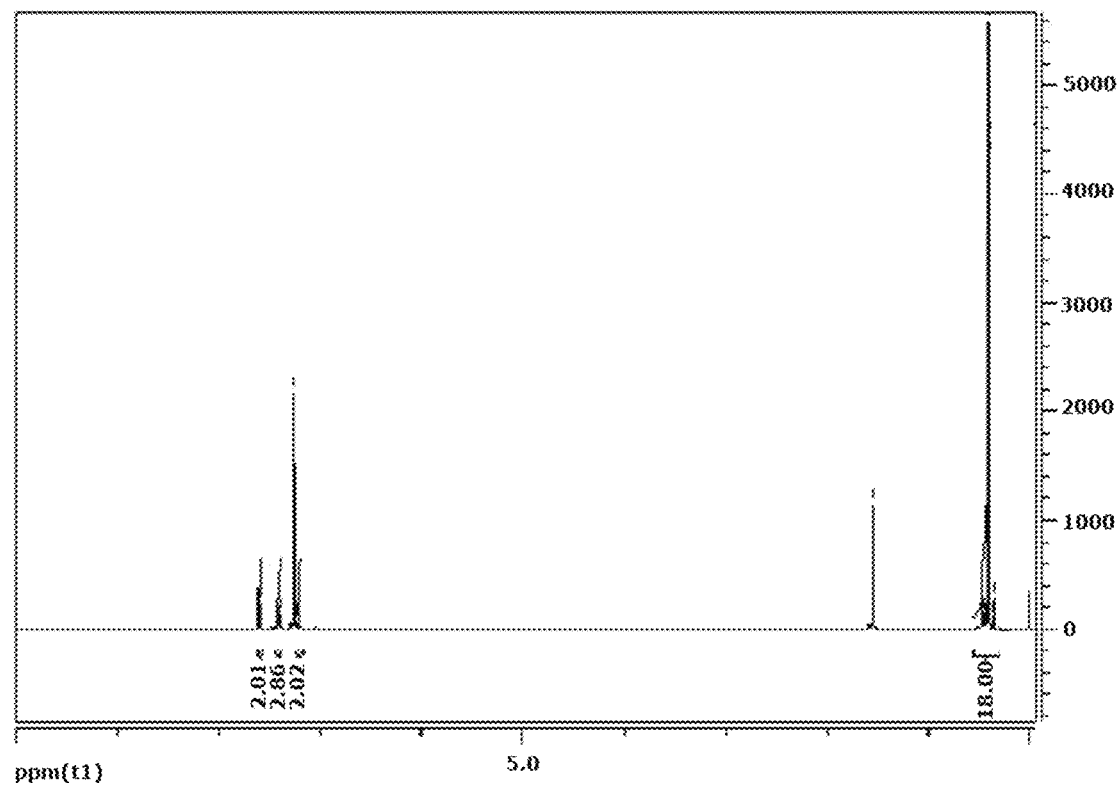

[Figure 4]
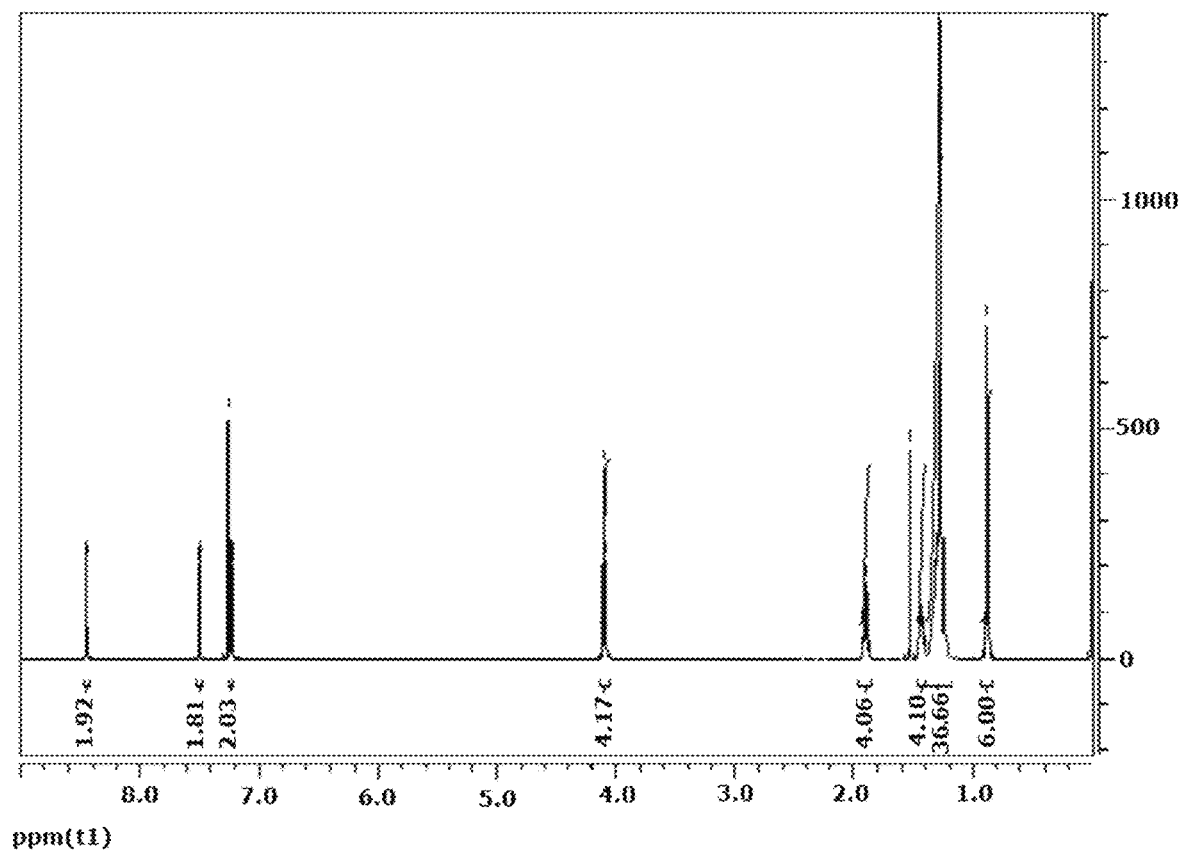

[Figure 5]
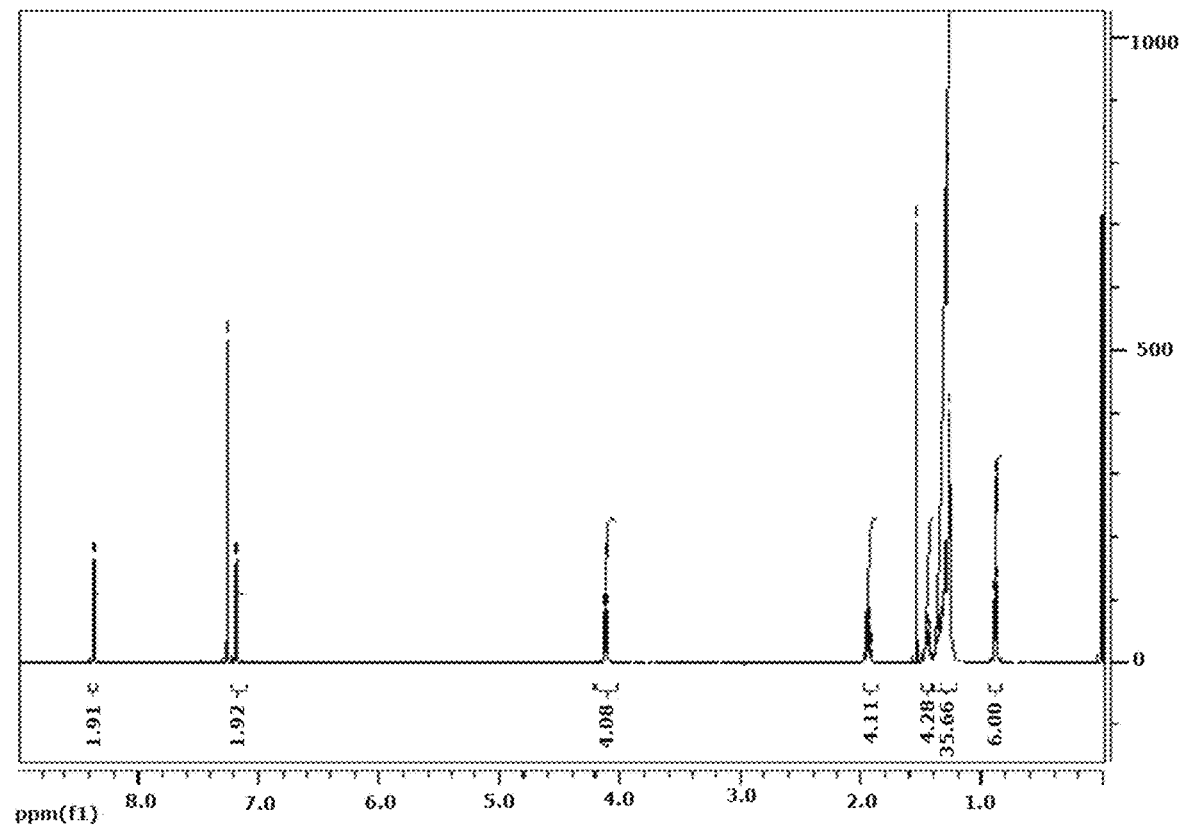
[Figure 6]
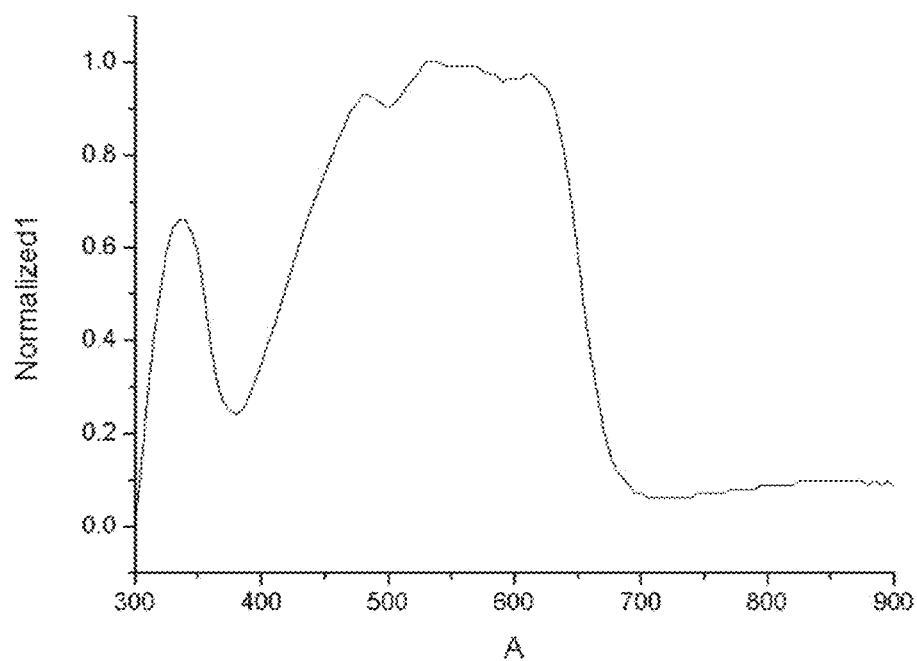

[Figure 7]
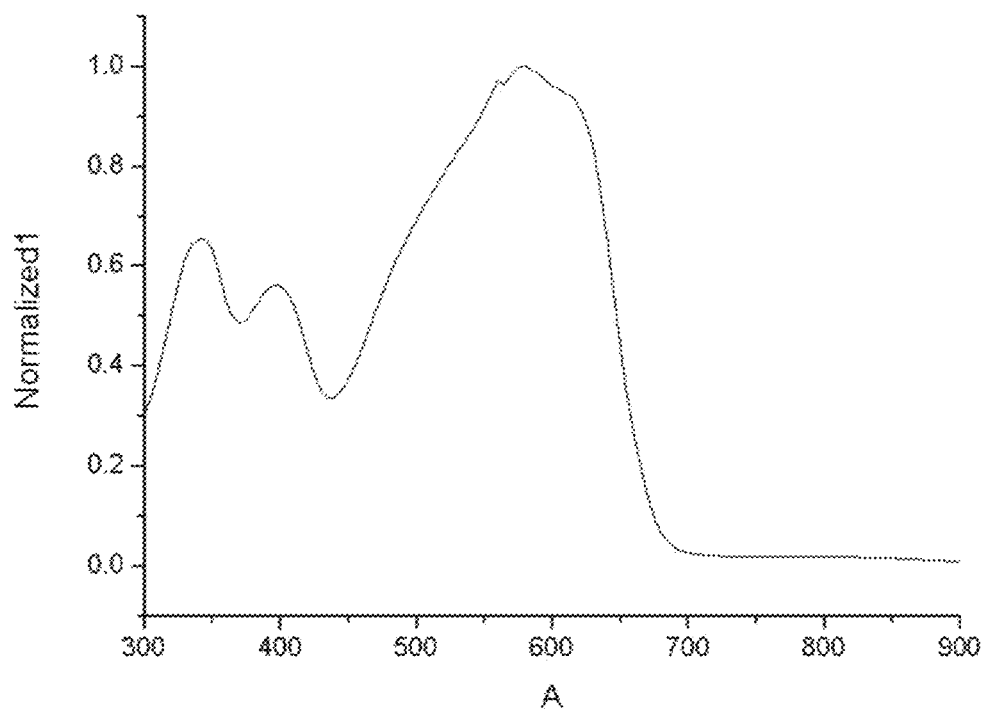
[Figure 8]
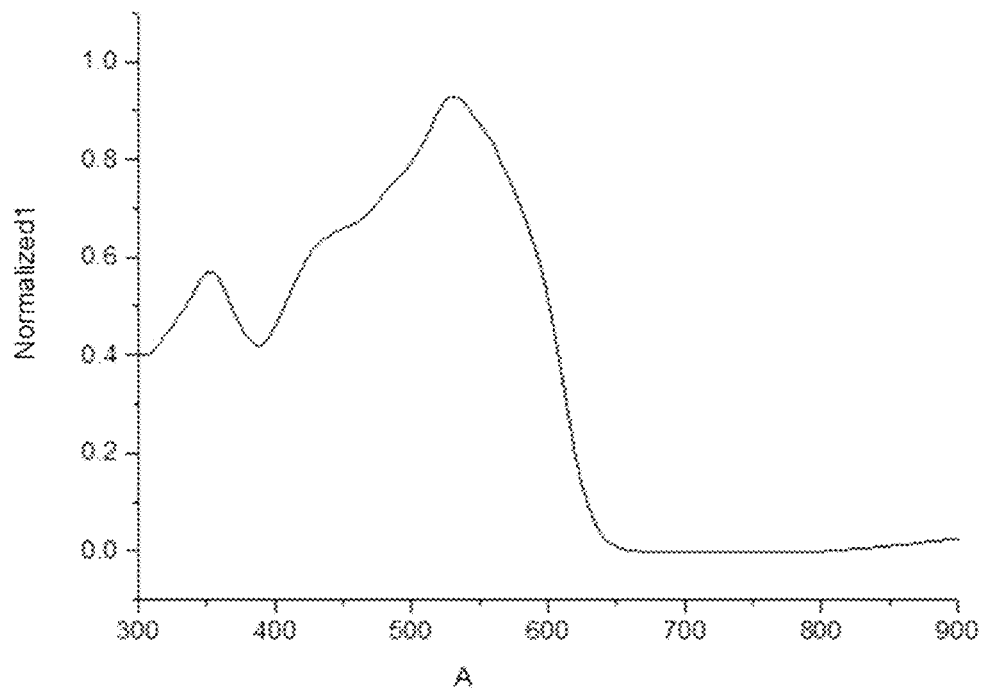

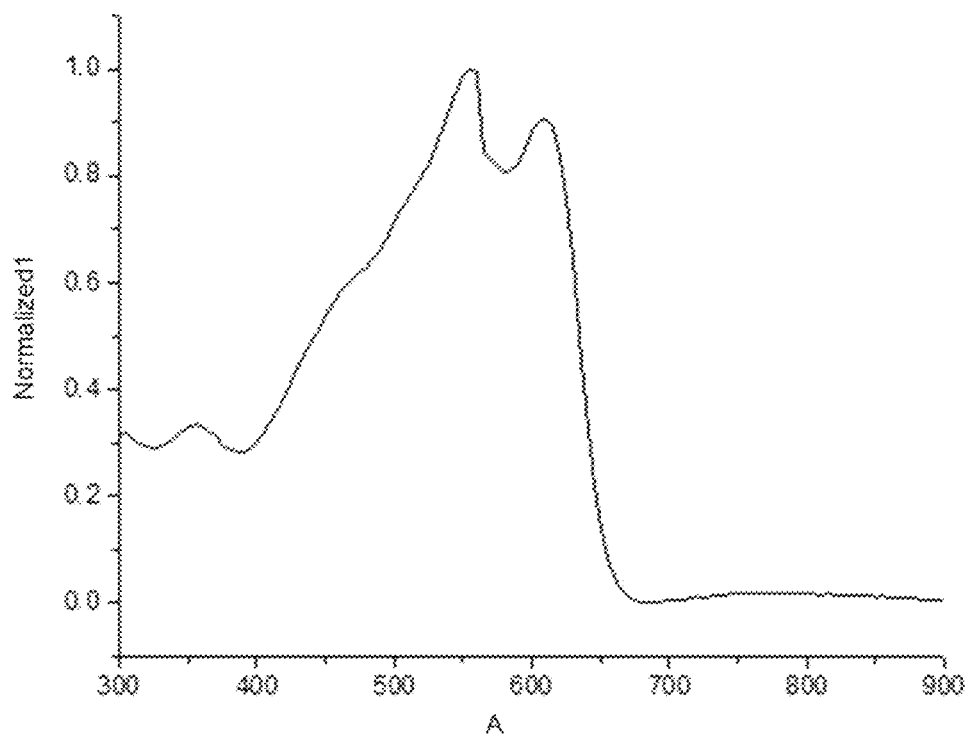
[Figure 9]

[Figure 10]
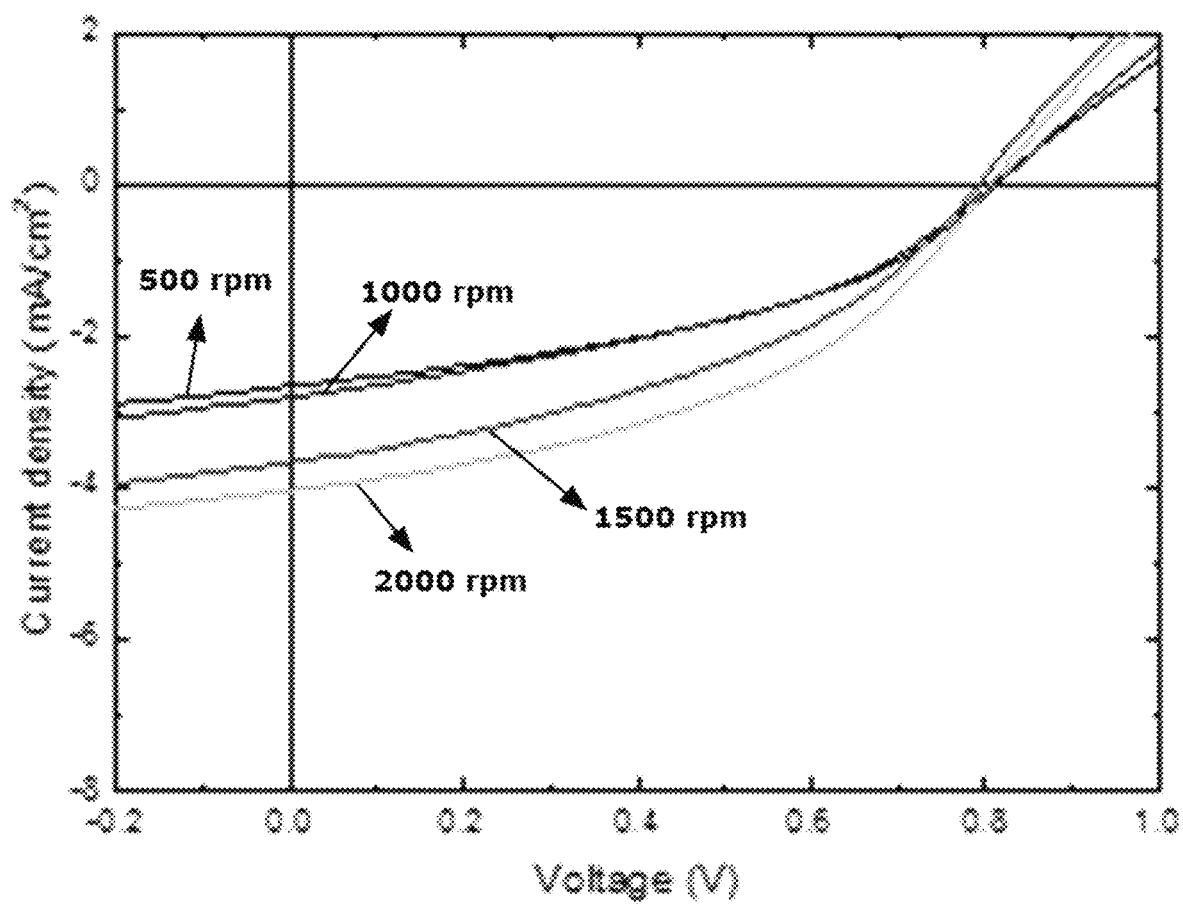

[Figure 11]
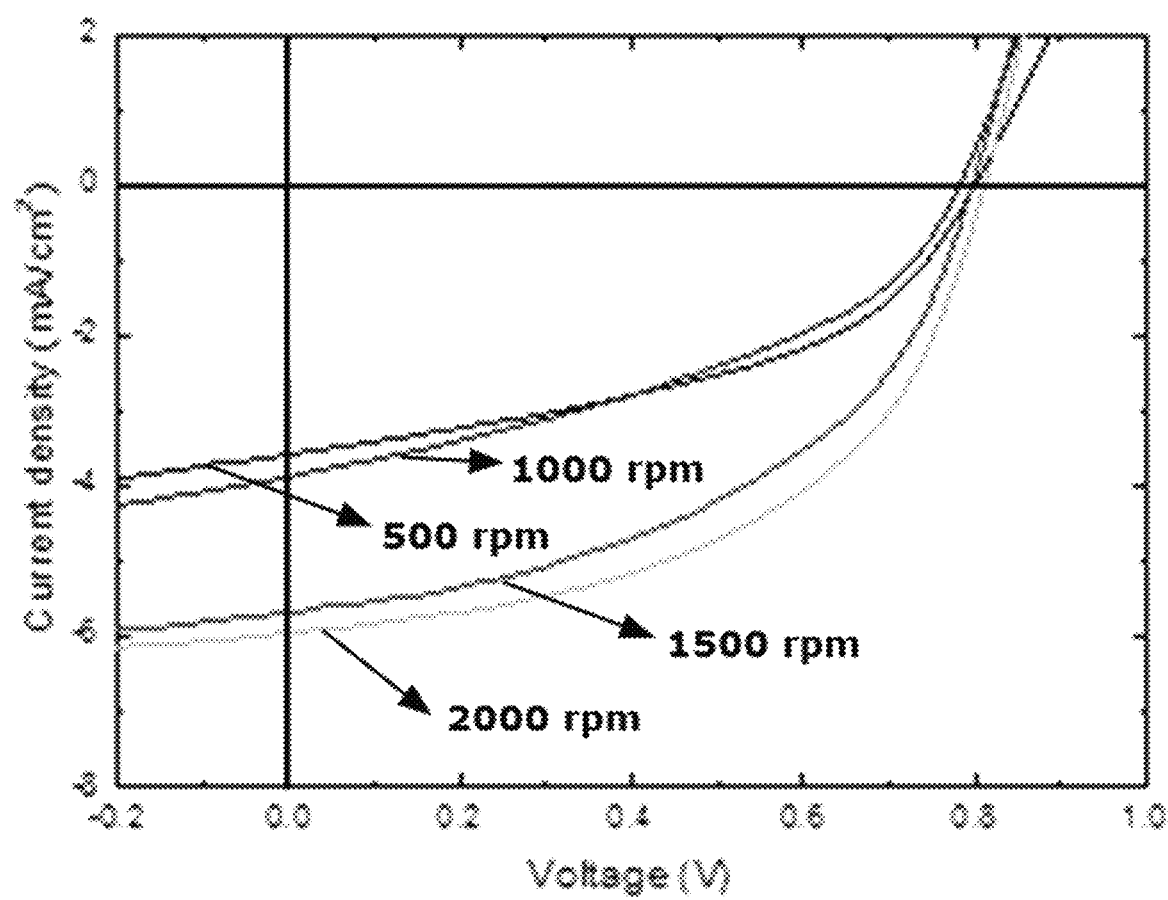

[Figure 12]
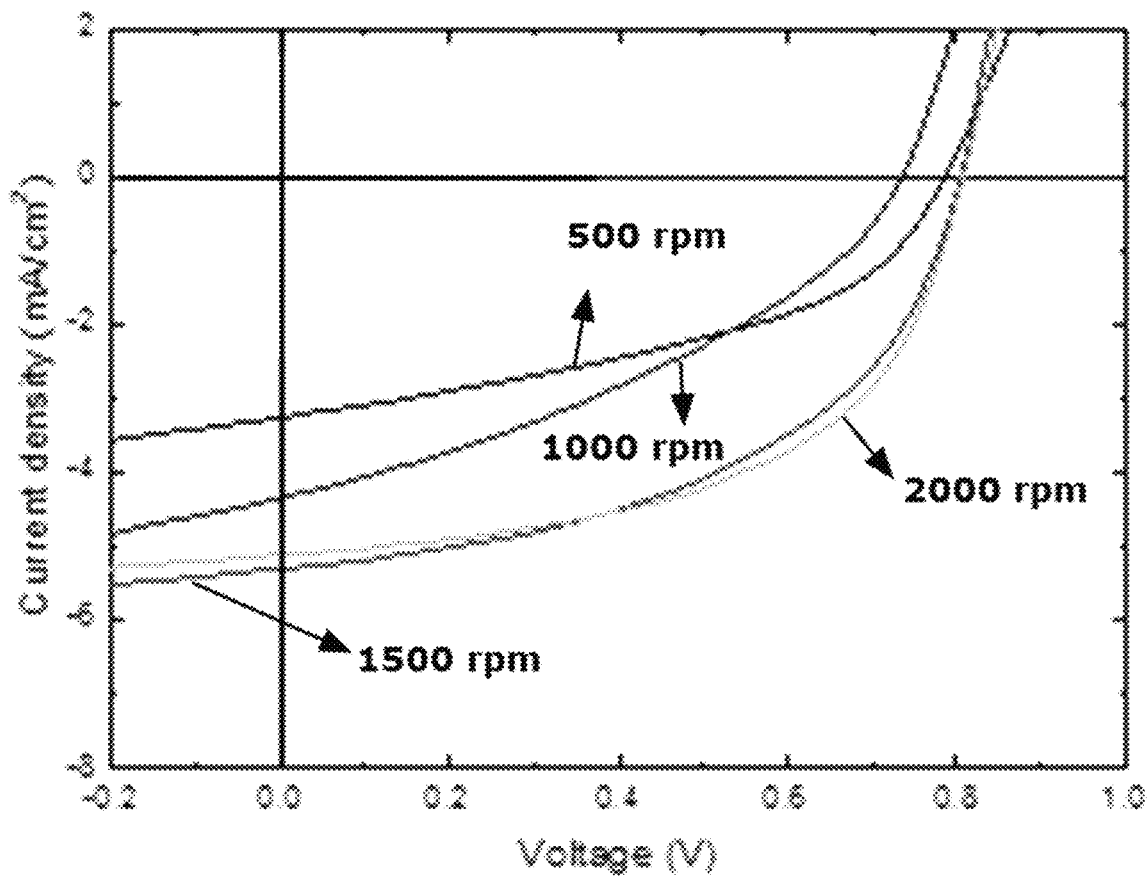

[Figure 13]
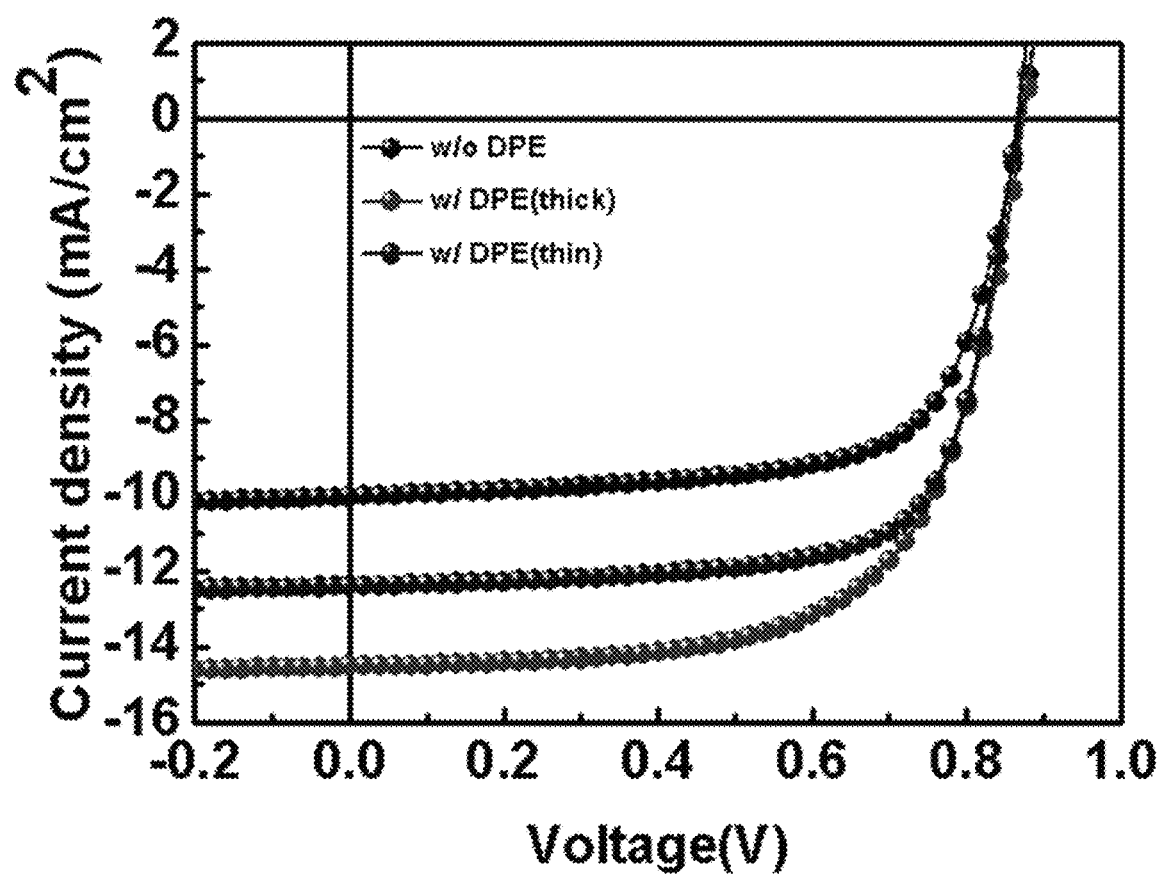

[Figure 14]
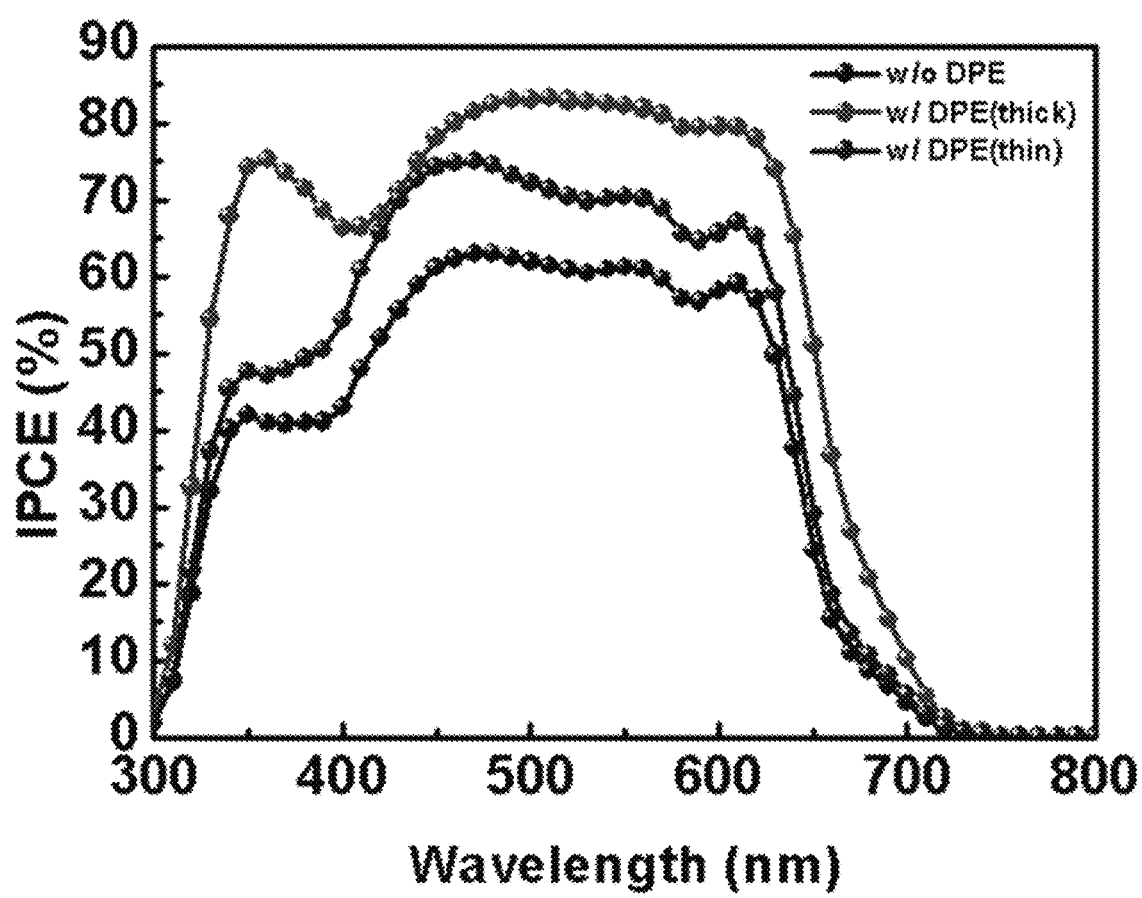

[Figure 15]
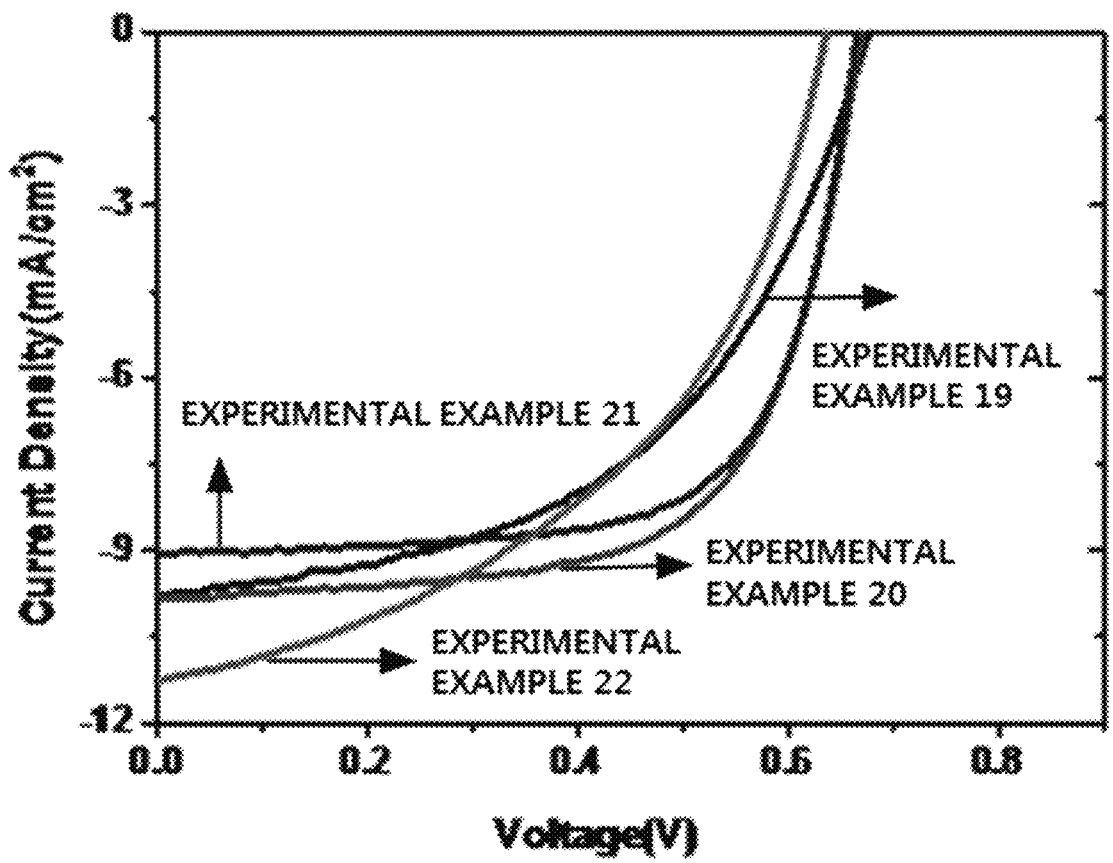

POLYMER AND ORGANIC SOLAR CELL COMPRISING SAME

TECHNICAL FIELD

This application is a National Stage Entry of International Application No. PCT/KR2015/013984, filed on Dec. 18, 2015, and claims the benefit of and priority to Korean Application No. 10-2014-0184885, filed on Dec. 19, 2014, all of which are hereby incorporated by reference in their entirety for all purposes as if fully set forth herein.

The present specification relates to a polymer and an organic solar cell including the same.

BACKGROUND ART

An organic solar cell is a device that may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as the ratio of electric power given to an external circuit and solar power entering the solar cell, and the efficiency have reached approximately 24% when measured under a currently standardized virtual solar irradiation condition. However, since inorganic solar cells in the related art already have shown the limitation in economic feasibility and material demands and supplies, an organic semiconductor solar cell, which is easily processed and inexpensive and has various functionalities, has come into the spotlight as a long-term alternative energy source.

For the solar cell, it is important to increase efficiency so as to output as much electric energy as possible from solar energy. In order to increase the efficiency of this solar cell, it is important to generate as many excitons as possible inside a semiconductor, but it is also important to pull the generated charges to the outside without loss. One of the reasons for the charge loss is the extinction of generated electrons and holes due to recombination. Various methods have been proposed to deliver generated electrons and holes to an electrode without loss, but additional processes are required in most cases, and accordingly, manufacturing costs may be increased.

CITATION LIST

Non-Patent Document

Two-layer organic photovoltaic cell (C. W. Tang, Appl. Phys. Lett., 48, 183. (1996))

Efficiencies via Network of Internal Donor-Acceptor Heterojunctions (G. Yu, J. Gao, J. C. Hummelen, F. Wudl, A. J. Heeger, Science, 270, 1789. (1995))

DETAILED DESCRIPTION OF THE INVENTION

Technical Problem

An object of the present specification is to provide a polymer and an organic solar cell including the same.

Technical Solution

The present specification provides a polymer including:
a first unit represented by the following Chemical Formula 1;
a second unit represented by the following Chemical Formula 2; and
a third unit represented by the following Chemical Formula 3 or 4.

[Chemical Formula 1]

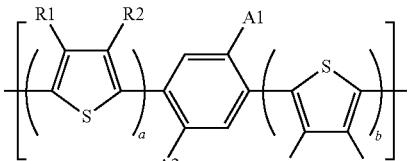

[Chemical Formula 2]

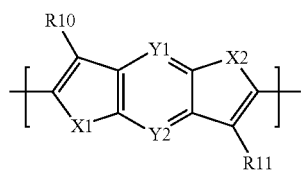

[Chemical Formula 3]

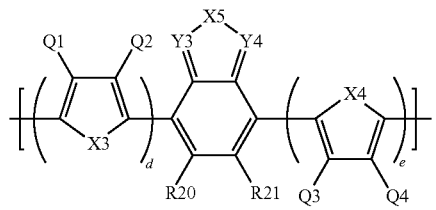

[Chemical Formula 4]

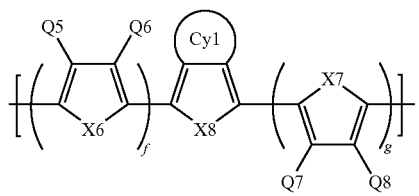

In Chemical Formulae 1 to 4,

X1 to X8 are the same as or different from each other, and are each independently selected from the group consisting of CRR', NR, O, SiRR', PR, S, GeRR', Se, and Te, Y1 to Y4 are the same as or different from each other, and are each independently selected from the group consisting of CR", N, SiR", P, and GeR", Cy1 is a substituted or unsubstituted hydrocarbon ring; or a substituted or unsubstituted hetero ring, R, R', R", Q1 to Q8, R1 to R4, R10, and R11 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted amine group; a substituted or unsubstituted aryl group; or a substituted or unsubstituted heterocyclic group, R20 and R21 are the same as or different from each other, and are each independently a substituted or unsubstituted alkoxy group; or a substituted or unsubstituted aryloxy group, a, b, d, e, f, and g are each an integer of 0 to 3, when a, b, d, e, f, and g are each 2 or more, two or more structures in the parenthesis are the same as or different from each other, and A1 and A2 are the same as or different from each other, and are each independently fluorine; or chlorine.

Further, the present specification provides an organic solar cell including: a first electrode; a second electrode provided to face the first electrode; and one or more organic material layers provided between the first electrode and the second electrode and including a photoactive layer, in which one or more layers of the organic material layers include the above-described polymer.

Advantageous Effects

A polymer according to an exemplary embodiment of the present specification has thermal stability as an electrically conductive material, and has high electron mobility. Accordingly, when the polymer is applied to an organic solar cell, it is possible to expect excellent electrical characteristics and excellent lifetime characteristics.

Further, the polymer according to an exemplary embodiment of the present specification has a high HOMO energy level, and thus, when an organic solar cell including the polymer is implemented, the organic solar cell has excellent open voltage characteristics.

BRIEF DESCRIPTION OF DRAWINGS

FIG. 1 is a view illustrating an organic solar cell according to an exemplary embodiment of the present specification.

FIG. 2 is a view illustrating an NMR spectrum of Chemical Formula A synthesized in Preparation Example 1.

FIG. 3 is a view illustrating an NMR spectrum of Chemical Formula A-1 synthesized in Preparation Example 1.

FIG. 4 is a view illustrating an NMR spectrum of Chemical Formula B-3 synthesized in Preparation Example 2.

FIG. 5 is a view illustrating an NMR spectrum of Chemical Formula B-4 synthesized in Preparation Example 2.

FIG. 6 is a view illustrating a UV-vis absorption spectrum of Polymer 1.

FIG. 7 is a view illustrating a UV-vis absorption spectrum of Polymer 2.

FIG. 8 is a view illustrating a UV-vis absorption spectrum of Polymer 3.

FIG. 9 is a view illustrating a UV-vis absorption spectrum of Polymer 4.

FIG. 10 is a view illustrating the current density according to the voltage of an organic solar cell according to the rpm of Experimental Example 1.

FIG. 11 is a view illustrating the current density according to the voltage of an organic solar cell according to the rpm of Experimental Example 2.

FIG. 12 is a view illustrating the current density according to the voltage of an organic solar cell according to the rpm of Experimental Example 3.

FIG. 13 is a view illustrating the current density according to the voltage of an organic solar cell according to Experimental Example 18.

FIG. 14 is a view illustrating the incident photoelectric conversion efficiency of the organic solar cell of Experimental Example 18.

FIG. 15 is a view illustrating the current density according to the voltage of organic solar cells according to Experimental Examples 19 to 22.

EXPLANATION OF REFERENCE NUMERALS AND SYMBOLS

101: Anode (ITO)
102: Hole transport layer (PEDOT:PSS)
103: Photoactive layer
104: Cathode (Al)

BEST MODE

Hereinafter, the present specification will be described in more detail.

In the present specification, the 'unit' means a repeated structure included in a monomer of a polymer, and a structure in which the monomer is bonded to the polymer by polymerization.

In the present specification, the meaning of 'including a unit' means that the unit is included in a main chain in the polymer.

When one part "includes" one constituent element in the present specification, unless otherwise specifically described, this does not mean that another constituent element is excluded, but means that another constituent element may be further included.

In the present specification, the energy level means the size of energy. Accordingly, even when the energy level is expressed in the negative (−) direction from the vacuum level, it is interpreted that the energy level means an absolute value of the corresponding energy value. For example, the HOMO energy level means the distance from the vacuum level to the highest occupied molecular orbital. Further, the LUMO energy level means the distance from the vacuum level to the lowest unoccupied molecular orbital.

A polymer according to an exemplary embodiment of the present specification includes: the first unit represented by Chemical Formula 1; the second unit represented by Chemical Formula 2; and the third unit represented by Chemical Formula 3 or 4.

Examples of the substituents will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or more substituents selected from the group consisting of deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted aryl group; and a substituted or unsubstituted heterocyclic group or being substituted with a substituent to which two or more substituents are linked among the substituents exemplified above, or having no substituent. For example, "the substituent to which two or more substituents are linked" may be a biphenyl group. That is, the biphenyl group may also be an aryl group, and may be interpreted as a substituent to which two phenyl groups are linked.

In the present specification, the number of carbon atoms of an imide group is not particularly limited, but is preferably 1 to 30. Specifically, the imide group may be a compound having the following structures, but is not limited thereto.

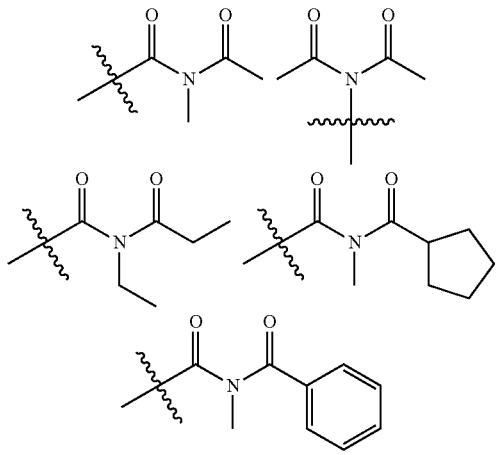

In the present specification, for an amide group, one or two nitrogen atoms of the amide group may be substituted with hydrogen, a straight-chained, branch-chained, or cyclic alkyl group having 1 to 30 carbon atoms, or an aryl group having 6 to 30 carbon atoms. Specifically, the amide group may be a compound having the following structural formulae, but is not limited thereto.

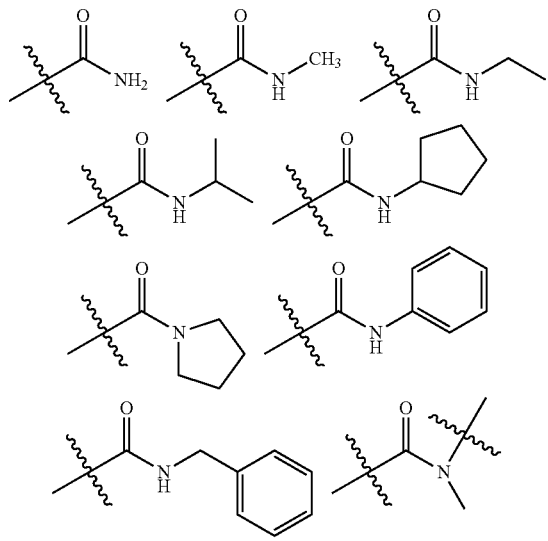

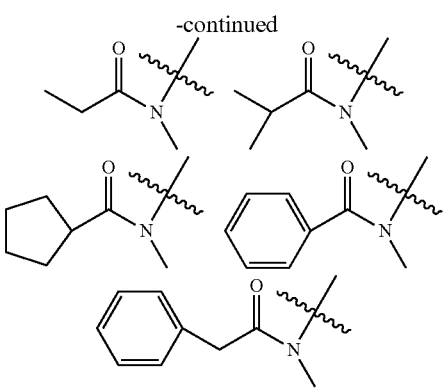

In the present specification, examples of a halogen group include fluorine, chlorine, bromine or iodine.

In the present specification, the alkyl group may be straight-chained or branch-chained, and the number of carbon atoms thereof is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, a cycloalkyl group is not particularly limited, but the number of carbon atoms thereof is preferably 3 to 60, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chained, branch-chained, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be straight-chained or branch-chained, and the number of carbon atoms thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, when the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

In the present specification, when the aryl group is a monocyclic aryl group, the number of carbon atoms thereof is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may combine with each other to form a ring.

When the fluorenyl group is substituted, the fluorenyl group may be

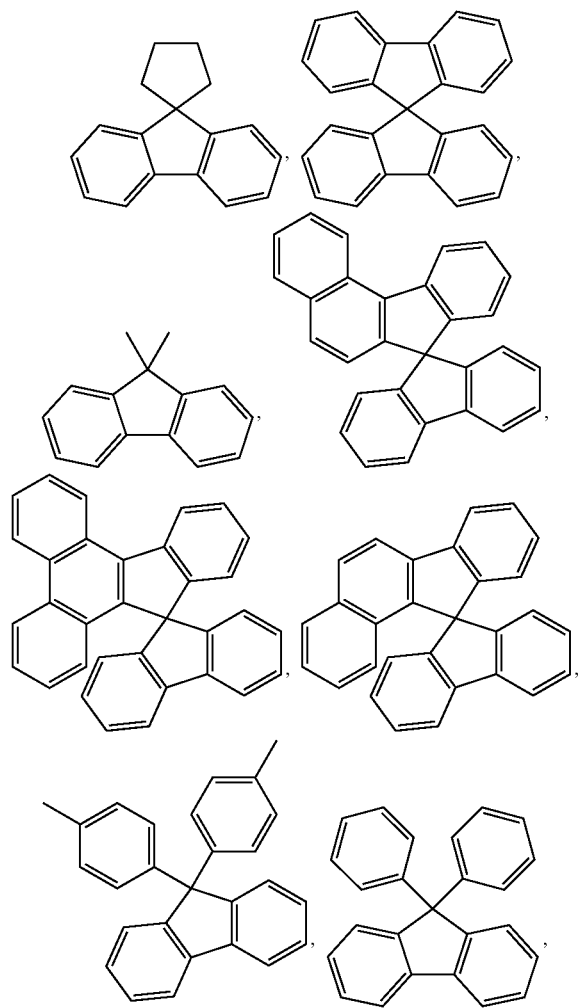

and the like.

However, the fluorenyl group is not limited thereto.

In the present specification, a heterocyclic group includes one or more of an atom other than carbon, that is, a heteroatom, and specifically, the heteroatom may include one or more atoms selected from the group consisting of O, N, Se, S, and the like. The number of carbon atoms of the heterocyclic group is not particularly limited, but is preferably 2 to 60. Examples of the heterocyclic group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the number of carbon atoms of an amine group is not particularly limited, but is preferably 1 to 30. The amine group is a group in which an N atom may be substituted with an aryl group, an alkyl group, an arylalkyl group, a heterocyclic group, and the like, and specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, the aryl group in the aryloxy group, the arylthioxy group, and the arylsulfoxy group is the same as the above-described examples of the aryl group. Specifically, examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthy, loxy, 1-anthry, loxy, 2-anthry, loxy, 9-anthry, loxy, 1-phenanthryloxy, 3-phenanthryloxy, 9-phenanthryloxy, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, the alkyl group in the alkylthioxy group and the alkylsulfoxy group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include mesyl, an ethylsulfoxy group, a propylsulfoxy group, a butylsulfoxy group, and the like, but the examples are not limited thereto.

In the present specification, the hydrocarbon ring may be cycloalkyl, cycloalkenyl, cyclic ketone, an aryl group, or a fused ring thereof, except for the hydrocarbon ring which is not monovalent group. The hetero ring may be cycloheteroalkyl, cycloheteroalkenyl, cycloheteroketone, an aliphatic hetero ring, an aromatic hetero ring, or a fused ring thereof, and may be selected from the examples of the hetero-cyclic group, except for the hetero ring which is not a monovalent group.

In the present specification, the hydrocarbon ring of Cy1 may be monocycle or polycycle as a structure fused with and linked to the structure of Chemical Formula 4, and may be aliphatic or aromatic. Furthermore, the hydrocarbon ring of Cy1 may be selected from the above-described examples of the aryl group or the cycloalkyl group, except for the hydrocarbon ring which is not a monovalent group.

In the specification, the hetero ring of Cy1 means that at least one carbon atom instead of carbon in the hydrocarbon ring is substituted with a heteroatom such as N, O, Se, and S being a heteroatom, and may be monocyclic or polycyclic, may be aliphatic or aromatic, and may be selected from the above-described examples of the hetero ring, except that the hetero ring which is not a monovalent group.

The hydrocarbon ring or the hetero ring may be cycloalkyl, cycloalkenyl, cyclic ketone, an aromatic ring, and an aliphatic ring, and may be monocyclic or polycyclic.

A polymer according to an exemplary embodiment of the present specification includes the first unit represented by Chemical Formula 1. In an exemplary embodiment of the present specification, A1 and A2 are substituted at the opposite positions of a benzene ring, that is, the para positions. In this case, A1 and A2 of the first unit interact with an S atom of the first unit, or interact with X1 and/or X2 of the second unit, thereby increasing the planarity of a polymer.

In an exemplary embodiment of the present specification, X1 is S.

In another exemplary embodiment, X2 is S.

In an exemplary embodiment of the present specification, Y1 is CR".

In another exemplary embodiment, Y2 is CR".

In an exemplary embodiment of the present specification, R10 is hydrogen.

In another exemplary embodiment, R11 is hydrogen.

In an exemplary embodiment of the present specification, the second unit represented by Chemical Formula 2 is represented by the following Chemical Formula 2-1.

[Chemical Formula 2-1]

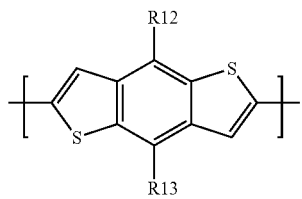

In Chemical Formula 2-1,

R12 and R13 are the same as or different from each other, and are each independently a substituted or unsubstituted alkyl group; a substituted or unsubstituted alkoxy group; a substituted or unsubstituted aryl group; or a substituted or unsubstituted heterocyclic group.

In an exemplary embodiment of the present specification, R12 and R13 are the same as or different from each other, and are each independently a substituted or unsubstituted hetero ring.

In another exemplary embodiment, R12 and R13 are the same as or different from each other, and are each independently a substituted or unsubstituted hetero ring including one or more S atoms.

In an exemplary embodiment of the present specification, R12 and R13 are the same as or different from each other, and are each independently a substituted or unsubstituted thiophene group.

In an exemplary embodiment of the present specification, the second unit represented by Chemical Formula 2 is represented by the following Chemical Formula 2-2.

[Chemical Formula 2-2]

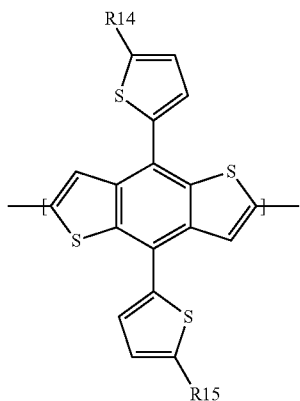

In Chemical Formula 2-2,

R14 and R15 are the same as or different from each other, and are each independently a substituted or unsubstituted alkyl group; or a substituted or unsubstituted alkoxy group.

In another exemplary embodiment, R14 and R15 are the same as or different from each other, and are each independently a substituted or unsubstituted alkyl group having 1 to 20 carbon atoms.

In still another exemplary embodiment, R14 and R15 are the same as or different from each other, and are each independently a substituted or unsubstituted 2-ethylhexyl group.

In an exemplary embodiment of the present specification, R14 and R15 are a 2-ethylhexyl group.

In an exemplary embodiment of the present specification, Cy1 is a substituted or unsubstituted 5-membered or 6-membered ring.

In another exemplary embodiment, Cy1 is a substituted or unsubstituted 5-membered or 6-membered hetero ring including one or more N atoms.

In still another exemplary embodiment, Cy1 is a monocyclic hetero ring including one or more N atoms of a substituted or unsubstituted 5-membered or 6-membered monocyclic hetero ring including one or more N atoms.

In an exemplary embodiment of the present specification, Cy1 is a substituted or unsubstituted 5-membered ring.

In an exemplary embodiment of the present specification, Cy1 is a substituted or unsubstituted 5-membered monocyclic ring.

In another exemplary embodiment, Cy1 is a substituted or unsubstituted 5-membered hetero ring.

In still another exemplary embodiment, Cy1 is a substituted or unsubstituted cyclic ketone group.

In yet another exemplary embodiment, Cy1 is a substituted or unsubstituted pyrrolidine-2,5-dione.

In still yet another exemplary embodiment, Cy1 is a pyrrolidine-2,5-dione substituted with a substituted or unsubstituted alkyl group.

In a further exemplary embodiment, Cy1 is a pyrrolidine-2,5-dione substituted with a substituted or unsubstituted 2-ethylhexyl group.

In another further exemplary embodiment, Cy1 is a pyrrolidine-2,5-dione substituted with a substituted or unsubstituted dodecanyl group.

In an exemplary embodiment of the present specification, X3 is S.

In another exemplary embodiment, X4 is S.

In an exemplary embodiment of the present specification, X5 is S.

In an exemplary embodiment of the present specification, Y3 is N.

In another exemplary embodiment, Y4 is N.

In another exemplary embodiment, d is 0.

In still another exemplary embodiment, d is 1.

In an exemplary embodiment of the present specification, e is 1.

In another exemplary embodiment, e is 0.

In an exemplary embodiment of the present specification, Q1 is hydrogen.

In an exemplary embodiment of the present specification, Q2 is hydrogen.

In an exemplary embodiment of the present specification, Q3 is hydrogen.

In one exemplary embodiment of the present specification, Q4 is hydrogen.

In an exemplary embodiment of the present specification, the third unit represented by Chemical Formula 3 is represented by the following Chemical Formula 3-1 or Chemical Formula 3-2.

In another exemplary embodiment, the third unit represented by Chemical Formula 4 is represented by the following Chemical Formula 3-3.

In an exemplary embodiment of the present specification, the third unit is represented by any one of the following Chemical Formulae 3-1 to 3-3.

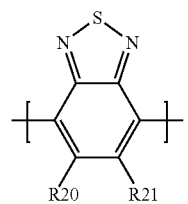

[Chemical Formula 3-1]

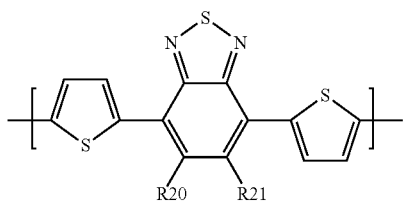

[Chemical Formula 3-2]

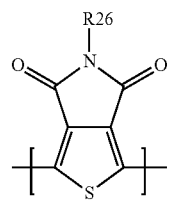

[Chemical Formula 3-3]

In Chemical Formulae 3-1 to 3-3,

R20 and R21 are the same as those defined in Chemical Formula 3, and

R26 is hydrogen; a halogen group; a substituted or unsubstituted alkyl group; a substituted or unsubstituted alkoxy group; a substituted or unsubstituted aryl group; or a substituted or unsubstituted heterocyclic group.

In an exemplary embodiment of the present specification, the polymer includes a unit represented by the following Chemical Formula 5 or the following Chemical Formula 6.

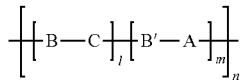

[Chemical Formula 5]

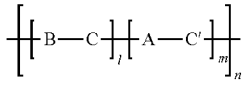

[Chemical Formula 6]

In Chemical Formulae 5 and 6, l is a molar ratio, and a real number of $0<l<1$, m is a molar ratio, and a real number of $0<m<1$, l+m=1, A is the first unit represented by Chemical Formula 1, B and B' are the same as or different from each other, and are each independently the second unit represented by Chemical Formula 2, C and C' are the same as or different from each other, and are each independently the third unit represented by Chemical Formula 3 or Chemical Formula 4, and n is a repeating number of the unit, and an integer of 1 to 10,000.

In an exemplary embodiment of the present specification, B of Chemical Formula 5 is the second unit represented by Chemical Formula 2-1, and a and b are 0.

In another exemplary embodiment of the present specification, C of Chemical Formula 6 is the third unit represented by Chemical Formula 3-1 or Chemical Formula 3-3, and a and b are an integer of 1 to 3.

In this case, A1 and A2 in the first unit represented by Chemical Formula 1 of the present invention interact with an S atom of thiophene; or A1 and A2 in the first unit represented by Chemical Formula 1 interact with an S atom of the second unit represented by Chemical Formula 2-1.

Here, the interaction means that chemical structures or atoms constituting the chemical structure forms a non-covalent bonding interaction, which affects each other by an action other than a covalent bond, and may mean, for example, a chalcogen bond.

A polymer according to an exemplary embodiment of the present specification minimizes a torsion angle with the backbone of the polymer through a non-covalent bonding interaction within the unit or with other units adjacent to the unit, thereby improving the planarity of the polymer. Further, the non-covalent bonding interaction improves the π-π stacking to improve the charge mobility due to the delocalization of polaron and exciton, and has an effect in that the packing is facilitated.

In addition, in an exemplary embodiment of the present specification, the third unit represented by Chemical Formula 3 may include R20 and R21 to form a planar structure through the interactions of O atoms of R20 and R21; A1 and A2 of the first unit represented by Chemical Formula 1; and an S atom of the second unit represented by Chemical Formula 2.

Accordingly, when the polymer according to an exemplary embodiment of the present specification is included, a device with high efficiency may be provided because an increase in open voltage may be induced.

In an exemplary embodiment of the present specification, the third unit is the unit represented by Chemical Formula 3-1.

In another exemplary embodiment, the third unit is the unit represented by Chemical Formula 3-2.

In still another exemplary embodiment, the third unit is the unit represented by Chemical Formula 3-3.

In an exemplary embodiment of the present specification, R1 is hydrogen.

In another exemplary embodiment, R2 is hydrogen.

In an exemplary embodiment of the present specification, R3 is hydrogen.

In one exemplary embodiment of the present specification, R4 is hydrogen.

In an exemplary embodiment of the present specification, a is 0.

In another exemplary embodiment, a is 1.

In an exemplary embodiment of the present specification, b is 0.

In another exemplary embodiment, b is 1.

In an exemplary embodiment of the present specification, R" is a substituted or unsubstituted alkoxy group; or a substituted or unsubstituted hetero ring.

In another exemplary embodiment, R" is a substituted or unsubstituted alkoxy group.

In still another exemplary embodiment, R" is a substituted or unsubstituted alkoxy group having 1 to 20 carbon atoms.

In yet another exemplary embodiment, R" is a substituted or unsubstituted dodecanyloxy group.

In an exemplary embodiment of the present specification, R" is dodecanyloxy.

In an exemplary embodiment of the present specification, R" is a substituted or unsubstituted hetero ring.

In another exemplary embodiment, R" is a substituted or unsubstituted hetero ring including one or more S atoms.

In still another exemplary embodiment, R" is a substituted or unsubstituted thiophene group.

In an exemplary embodiment of the present specification, R" is a thiophene group substituted with an alkyl group.

In an exemplary embodiment of the present specification, R" is a thiophene group substituted with an alkyl group having 1 to 20 carbon atoms.

In another exemplary embodiment, R" is a thiophene group substituted with a 2-ethylhexyl group.

In an exemplary embodiment of the present specification, R12 and R13 are the same as or different from each other, and are each independently a thiophene group substituted with an alkyl group.

In an exemplary embodiment of the present specification, R12 and R13 are a thiophene group substituted with a 2-ethylhexyl group.

In an exemplary embodiment of the present specification, R20 and R21 are the same as or different from each other, and are each independently a substituted or unsubstituted alkoxy group.

In another exemplary embodiment, R20 and R21 are the same as or different from each other, and are each independently a substituted or unsubstituted alkoxy group having 1 to 20 carbon atoms.

In still another exemplary embodiment, R20 and R21 are the same as or different from each other, and are each independently a substituted or unsubstituted dodecanyloxy group.

In an exemplary embodiment of the present specification, R20 and R21 are dodecanyloxy.

In an exemplary embodiment of the present specification, R26 is a substituted or unsubstituted alkyl group.

In another exemplary embodiment, R26 is a substituted or unsubstituted alkyl group having 1 to 30 carbon atoms.

In still another exemplary embodiment, R26 is a substituted or unsubstituted 2-ethylhexyl group.

In yet another exemplary embodiment, R26 is a 2-ethylhexyl group.

In still yet another exemplary embodiment, R26 is a substituted or unsubstituted dodecanyl group.

In a further exemplary embodiment, R26 is a dodecanyl group.

In an exemplary embodiment of the present specification, the polymer includes a unit represented by any one of the following Chemical Formula 7 to the following Chemical Formula 11.

[Chemical Formula 7]

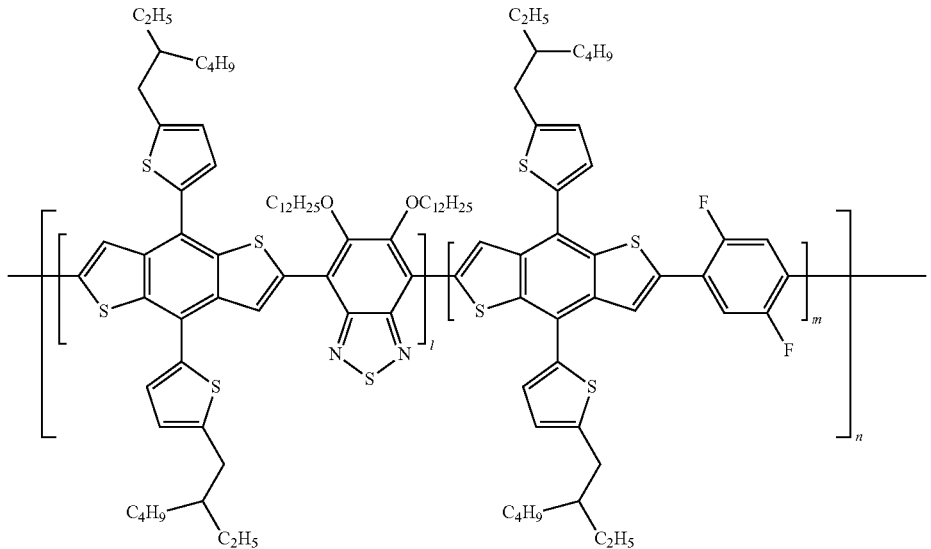

-continued
[Chemical Formula 8]
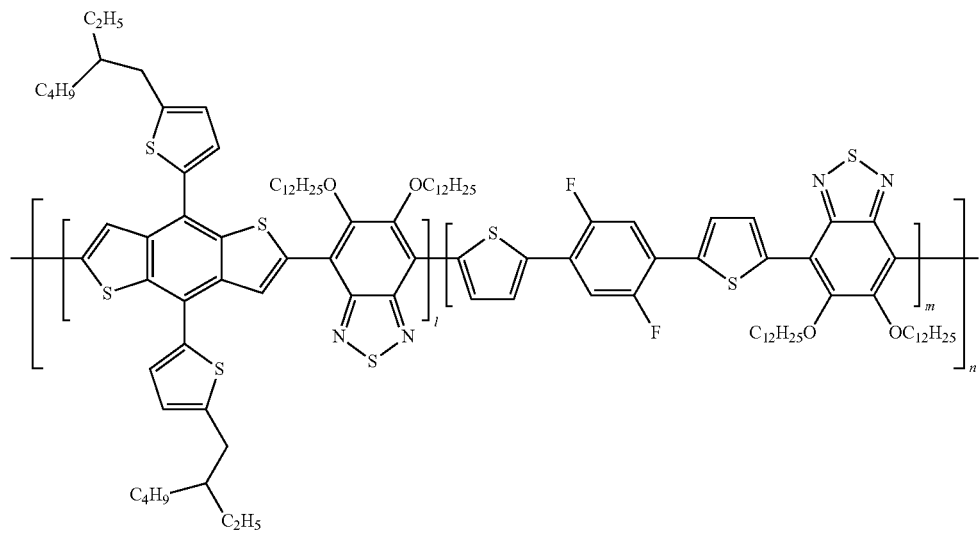
[Chemical Formula 9]
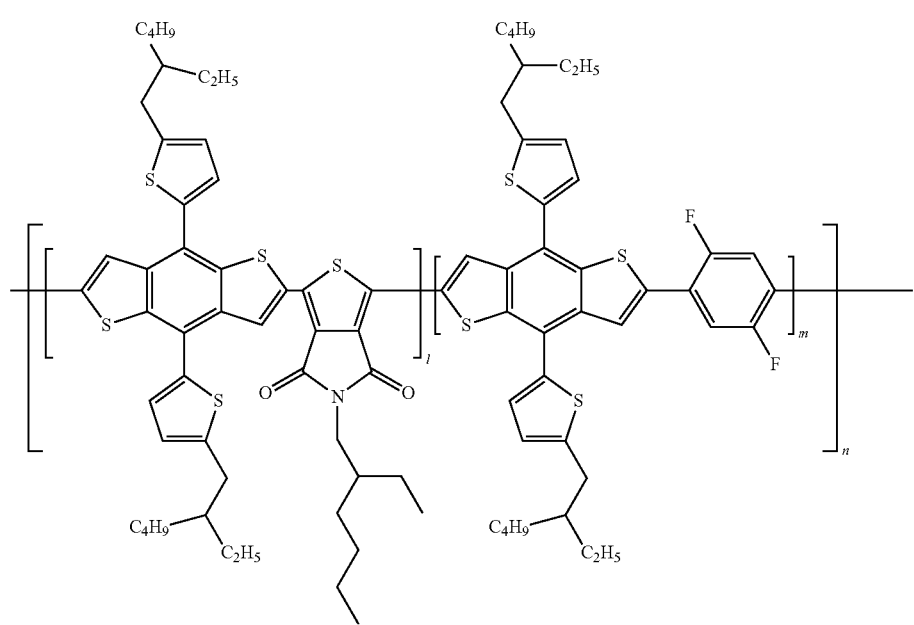

-continued

[Chemical Formula 10]

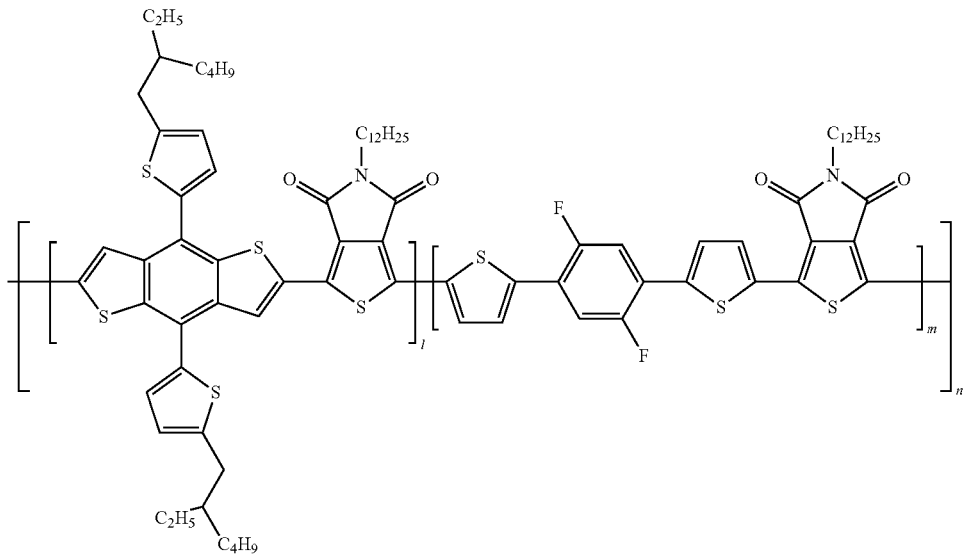

[Chemical Formula 11]

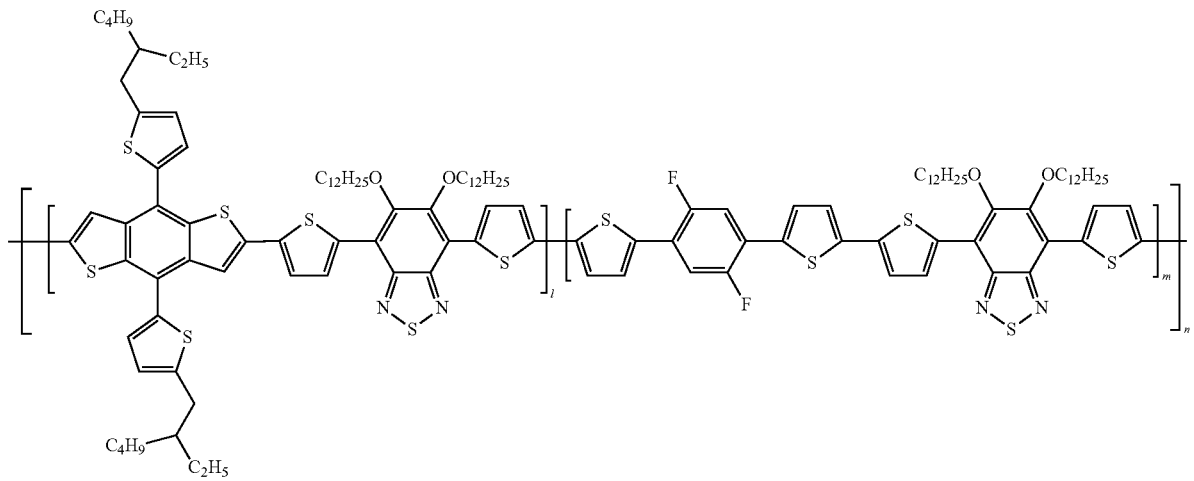

In Chemical Formulae 7 to 11, l is a molar ratio, and a real number of 0<l<1, m is a molar ratio, and a real number of 0<m<1, l+m=1, and n is a repeating number of the unit, and an integer of 1 to 10,000.

In an exemplary embodiment of the present specification, l is 0.5.

In another exemplary embodiment, m is 0.5.

In another exemplary embodiment of the present specification, l is 0.75.

In an exemplary embodiment of the present specification, m is 0.25.

In an exemplary embodiment of the present specification, the polymer is a random polymer. Further, the random polymer has an economic effect in which time and costs are reduced in the process of manufacturing a device due to the improved solubility.

In an exemplary embodiment of the present specification, an end group of the polymer is a heterocyclic group or an aryl group.

In an exemplary embodiment of the present specification, an end group of the polymer is a 4-(trifluoromethyl)phenyl group.

In an exemplary embodiment of the present specification, an end group of the polymer is a bromo-thiophene group.

In another exemplary embodiment, an end group of the polymer is a trifluoro-benzene group.

According to an exemplary embodiment of the present specification, a number average molecular weight of the polymer is preferably 5,000 g/mol to 1,000,000 g/mol.

According to an exemplary embodiment of the present specification, the polymer may have a molecular weight distribution of 1 to 10. Preferably, the polymer has a molecular weight distribution of 1 to 3.

The lower the molecular weight distribution is and the higher the number average molecular weight becomes, the better electrical characteristics and mechanical characteristics become.

Further, the number average molecular weight is preferably 100,000 or less, such that the polymer has predetermined or more solubility, and thus, a solution application method is advantageously applied.

The polymer may be prepared based on the Preparation Examples to be described below. The monomer of each unit of the polymer was prepared by using chlorobenzene as a solvent, adding $Pd_2(dba)_3$ and $P(o\text{-tolyl})_3$ to the solvent, and polymerizing the mixture in a microwave reactor.

The polymer according to the present specification may be prepared by a multi-step chemical reaction. Monomers are prepared through an alkylation reaction, a Grignard reaction, a Suzuki coupling reaction, a Stille coupling reaction, and the like, and then final polymers may be prepared through a carbon-carbon coupling reaction such as a Stille coupling reaction. When the substituent to be introduced is a boronic acid or boronic ester compound, the polymer may be prepared through a Suzuki coupling reaction, and when the substituent to be introduced is a tributyltin or trimethyltin compound, the polymer may be prepared through a Stille coupling reaction, but the method is not limited thereto.

An exemplary embodiment of the present specification provides an organic solar cell including: a first electrode; a second electrode provided to face the first electrode; and one or more organic material layers provided between the first electrode and the second electrode and including a photoactive layer, in which one or more layers of the organic material layers include the polymer.

When one member is disposed "on" another member in the present specification, this includes not only a case where the one member is brought into contact with another member, but also a case where still another member is present between the two members.

The organic solar cell according to an exemplary embodiment of the present specification includes a first electrode, a photoactive layer, and a second electrode. The organic solar cell may further include a substrate, a hole transport layer, and/or an electron transport layer.

In an exemplary embodiment of the present specification, when the organic solar cell accepts a photon from an external light source, an electron and a hole are generated between an electron donor and an electron acceptor. The generated hole is transported to a positive electrode through an electron donor layer.

In an exemplary embodiment of the present specification, the organic material layer includes a hole transport layer, a hole injection layer, or a layer which simultaneously transports and injects holes, and the hole transport layer, the hole injection layer, or the layer which simultaneously transports and injects holes includes the polymer.

In another exemplary embodiment, the organic material layer includes an electron injection layer, an electron transport layer, or a layer which simultaneously injects and transports electrons, and the electron injection layer, the electron transport layer, or the layer which simultaneously injects and transports electrons includes the polymer.

FIG. 1 is a view illustrating an organic solar cell according to an exemplary embodiment of the present specification.

In an exemplary embodiment of the present specification, when the organic solar cell accepts a photon from an external light source, an electron and a hole are generated between an electron donor and an electron acceptor. The generated hole is transported to a positive electrode through an electron donor layer.

In an exemplary embodiment of the present specification, the organic solar cell may further include an additional organic material layer. The organic solar cell may reduce the number of organic material layers by using an organic material which simultaneously has various functions.

In an exemplary embodiment of the present specification, the first electrode is an anode, and the second electrode is a cathode. In another exemplary embodiment, the first electrode is a cathode, and the second electrode is an anode.

In an exemplary embodiment of the present specification, in the organic solar cell, a cathode, a photoactive layer, and an anode may be arranged in this order, and an anode, a photoactive layer, and a cathode may be arranged in this order, but the arrangement order is not limited thereto.

In another exemplary embodiment, in the organic solar cell, an anode, a hole transport layer, a photoactive layer, an electron transport layer, and a cathode may also be arranged in this order, and a cathode, an electron transport layer, a photoactive layer, a hole transport layer, and an anode may also be arranged in this order, but the arrangement order is not limited thereto.

In an exemplary embodiment of the present specification, the organic solar cell has a normal structure. The normal structure may mean that an anode is formed on a substrate. Specifically, according to an exemplary embodiment of the present specification, when the organic solar cell has a normal structure, a first electrode to be formed on a substrate may be an anode.

In an exemplary embodiment of the present specification, the organic solar cell has an inverted structure. The inverted structure may mean that a cathode is formed on a substrate. Specifically, according to an exemplary embodiment of the present specification, when the organic solar cell has an inverted structure, a first electrode to be formed on a substrate may be a cathode.

In an exemplary embodiment of the present specification, the organic solar cell has a tandem structure. In this case, the organic solar cell may include two or more photoactive layers. The organic solar cell according to an exemplary embodiment of the present specification may have one or two or more photoactive layers.

In another exemplary embodiment, a buffer layer may be provided between a photoactive layer and a hole transport layer, or between a photoactive layer and an electron transport layer. In this case, a hole injection layer may be further provided between an anode and the hole transport layer. Further, an electron injection layer may be further provided between a cathode and the electron transport layer.

In an exemplary embodiment of the present specification, the photoactive layer includes one or two or more selected from the group consisting of an electron donor and an electron acceptor, and the electron donor material includes the polymer.

In an exemplary embodiment of the present specification, the electron acceptor material may be selected from the group consisting of fullerene, fullerene derivatives, bathocuproine, semi-conducting elements, semi-conducting compounds, and combinations thereof. Specifically, the electron acceptor material is one or two or more compounds selected from the group consisting of fullerene, fullerene derivatives ((6,6)-phenyl-C61-butyric acid-methylester (PCBM) or (6,6)-phenyl-C61-butyric acid-cholesteryl ester (PCBCR)), perylene, polybenzimidazole (PBI), and 3,4,9,10-perylene-tetracarboxylic bis-benzimidazole (PTCBI).

In an exemplary embodiment of the present specification, the electron donor and the electron acceptor constitute a bulk heterojunction (BHJ).

The bulk heterojunction means that an electron donor material and an electron acceptor material are mixed with each other in a photoactive layer.

In an exemplary embodiment of the present specification, the photoactive layer further includes an additive.

In an exemplary embodiment of the present specification, the additive has a molecular weight of 50 g/mol to 300 g/mol.

In another exemplary embodiment, the additive is an organic material having a boiling point of 30° C. to 300° C.

In the present specification, the organic material means a material including at least one or more carbon atoms.

In another exemplary embodiment, the additive may further include one or two additives selected from the group consisting of 1,8-diiodooctane (DIO), 1-chloronaphthalene (1-CN), diphenylether (DPE), octane dithiol, and tetrabromothiophene.

In an exemplary embodiment of the present specification, the photoactive layer has a bilayer thin film structure including an n-type organic material layer and a p-type organic material layer, and the p-type organic material layer includes the polymer.

In the present specification, the substrate may be a glass substrate or a transparent plastic substrate having excellent transparency, surface smoothness, ease of handling, and waterproofing properties, but is not limited thereto, and the substrate is not limited as long as the substrate is typically used in the organic solar cell. Specific examples thereof include glass or polyethylene terephthalate (PET), polyethylene naphthalate (PEN), polypropylene (PP), polyimide (PI), triacetyl cellulose (TAC), and the like, but are not limited thereto.

The anode electrode may be a material which is transparent and has excellent conductivity, but is not limited thereto. Examples thereof include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly[3,4-(ethylene-1,2-dioxy)thiophene] (PEDOT), polypyrrole, and polyaniline, and the like, but are not limited thereto.

A method of forming the anode electrode is not particularly limited, but the anode electrode may be formed, for example, by being applied onto one surface of a substrate using sputtering, e-beam, thermal deposition, spin coating, screen printing, inkjet printing, doctor blade, or a gravure printing method, or by being coated in the form of a film.

When the anode electrode is formed on a substrate, the anode electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100 to 150° C. for 1 to 30 minutes, preferably at 120° C. for 10 minutes in order to remove moisture, and when the substrate is completely cleaned, the surface of the substrate is hydrophilically modified.

Through the surface modification as described above, the junction surface potential may be maintained at a level suitable for a surface potential of a photoactive layer. Further, during the modification, a polymer thin film may be easily formed on an anode electrode, and the quality of the thin film may also be improved.

Examples of a pre-treatment technology for the anode electrode include a) a surface oxidation method using a parallel plate-type discharge, b) a method of oxidizing the surface through ozone produced by using UV (ultraviolet) rays in a vacuum state, c) an oxidation method using oxygen radicals produced by plasma, and the like.

One of the methods may be selected depending on the state of the anode electrode or the substrate. However, even though any method is used, it is preferred to commonly prevent oxygen from leaving from the surface of the anode electrode or the substrate, and maximally suppress moisture and organic materials from remaining. In this case, it is possible to maximize a substantial effect of the pre-treatment.

As a specific example, it is possible to use a method of oxidizing the surface through ozone produced by using UV. In this case, a patterned ITO substrate after being ultrasonically cleaned is baked on a hot plate and dried well, and then introduced into a chamber, and the ITO substrate patterned may be cleaned by ozone generated by reacting an oxygen gas with UV light by operating a UV lamp.

However, the surface modification method of the ITO substrate patterned in the present specification needs not be particularly limited, and any method may be used as long as the method is a method of oxidizing a substrate.

The cathode electrode may be a metal having a low work function, but is not limited thereto. Specific examples thereof include: a metal, such as magnesium, calcium, sodium, potassium, titanium, indium, yttrium, lithium, gadolinium, aluminum, silver, tin, and lead, or alloys thereof; and a multi-layered material, such as LiF/Al, $LiO_2$/Al, LiF/Fe, Al:Li, Al:$BaF_2$, and Al:$BaF_2$:Ba, but are not limited thereto.

The cathode electrode may be deposited and formed in a thermal evaporator showing a vacuum degree of $5 \times 10^{-7}$ torr or less, but the forming method is not limited to this method.

The hole transport layer and/or electron transport layer materials serve to efficiently transfer electrons and holes separated from a photoactive layer to an electrode, and the materials are not particularly limited.

The hole transport layer material may be poly(3,4-ethylenediocythiophene) doped with poly(styrenesulfonic acid (PEDOT:PSS); molybdenum oxide ($MoO_x$); vanadium oxide ($V_2O_5$); nickel oxide (NiO); and tungsten oxide ($WO_x$), and the like, but is not limited thereto.

The electron transport layer material may be electron-extracting metal oxides, and specific examples thereof include: a metal complex of 8-hydroxyquinoline; a complex including $Alq_3$; a metal complex including Liq; LiF; Ca; titanium oxide ($TiO_x$); zinc oxide (ZnO); and cesium carbonate ($Cs_2CO_3$), and the like, but are not limited thereto.

A photoactive layer may be formed by dissolving a photoactive material such as an electron donor and/or an electron acceptor in an organic solvent, and then applying the solution by a method such as spin coating, dip coating, screen printing, spray coating, doctor blade, and brush painting, but the forming method is not limited thereto.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided for more completely explaining the present specification to the person with ordinary skill in the art.

Preparation Example 1. Preparation of Chemical Formula A-1

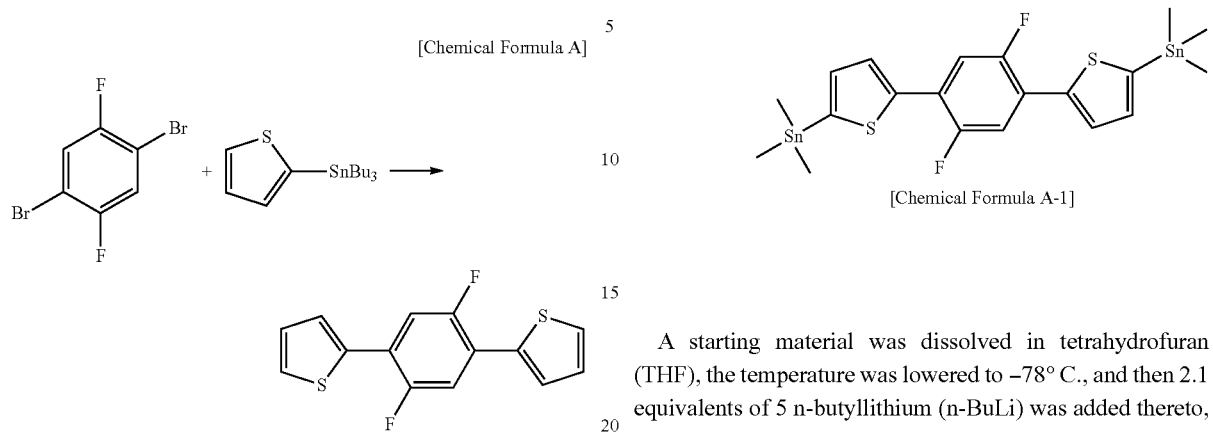

Toluene was put into two starting materials, 0.05 equivalent of tetrakis(triphenylphosphine)palladium(0) (Pd(PPh₃)₄) was added thereto, and then when the resulting mixture was stirred at 80° C. for 15 hours, it can be seen that the reaction solution was gradually turning black. A work up was performed on the reaction solution, the reaction solution was dried over magnesium sulfate, and then recrystallization was performed to obtain 4.3 g of a white powder.

FIG. 2 is a view illustrating an NMR spectrum of Chemical Formula A synthesized in Preparation Example 1.

A starting material was dissolved in tetrahydrofuran (THF), the temperature was lowered to −78° C., and then 2.1 equivalents of 5 n-butyllithium (n-BuLi) was added thereto, and then the resulting solution was stirred for 30 minutes. When the solution was additionally stirred at room temperature for 1 hour, the color of the solution turned yellow. Again, the temperature was lowered to −78° C., 2.1 equivalents of trimethyltin chloride was added thereto, and the resulting solution was stirred for 12 hours while slowly raising the temperature to room temperature. After 12 hours, the color of the solution turned ocher, and when a work up was performed on the solution, and then a recrystallization was performed, a glossy yellow plate-like solid could be obtained.

FIG. 3 is a view illustrating an NMR spectrum of Chemical Formula A-1 synthesized in Preparation Example 1.

Preparation Example 2. Preparation of Chemical Formula B

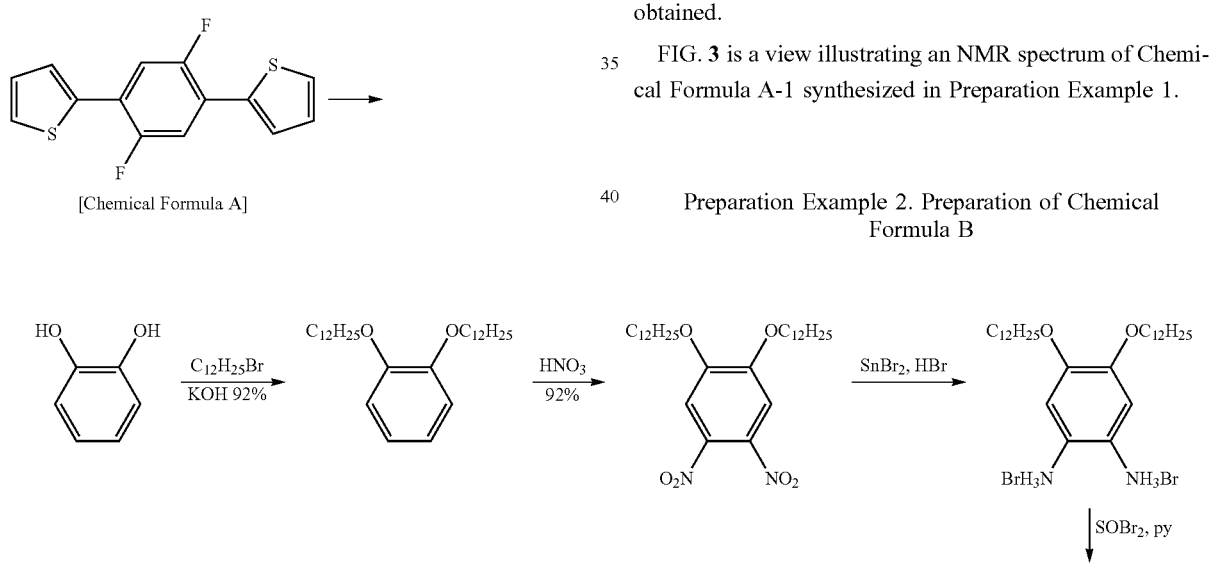

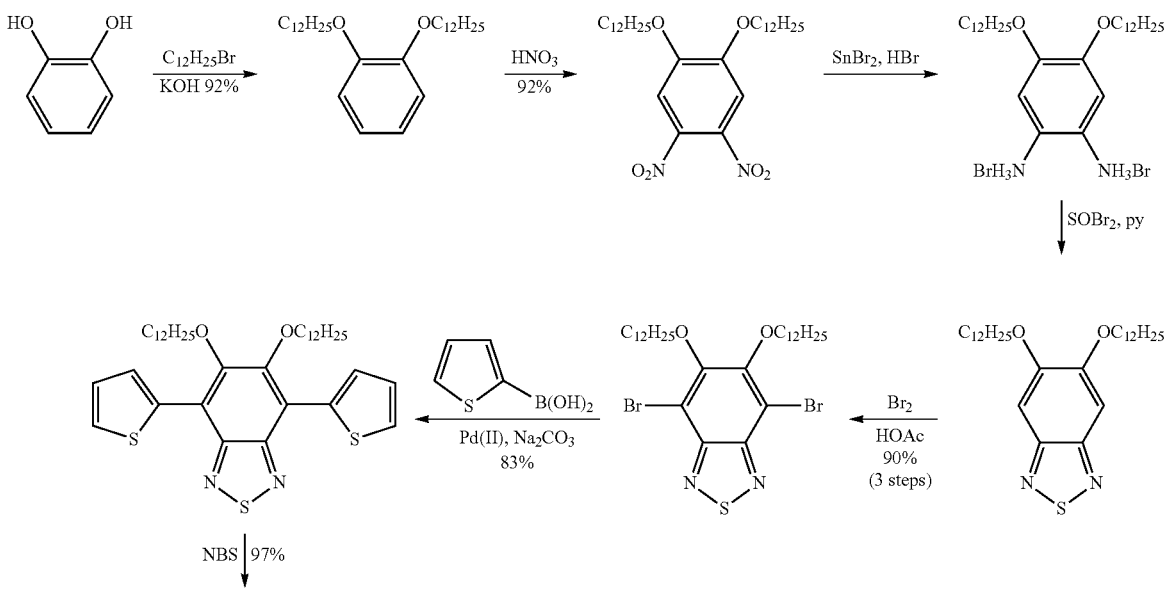

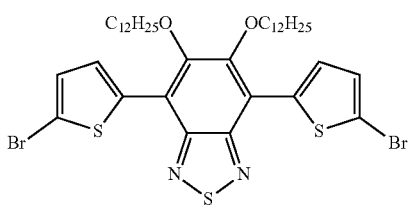

[Chemical Formula B]

The compound of Chemical Formula B was synthesized based on JOURNAL OF POLYMER SCIENCE PART A: POLYMER CHEMISTRY 2011, 49, 4387-4397 4389.

FIG. 4 is a view illustrating an NMR spectrum of Chemical Formula B-3 synthesized in Preparation Example 2.

FIG. 5 is a view illustrating an NMR spectrum of Chemical Formula B-4 synthesized in Preparation Example 2.

Preparation Example 3. Synthesis of Chemical Formula C-1 added to the solution, and the resulting solution was additionally stirred for 3 hours. Ice was poured into the solution, the solution was extracted twice with diethyl ether, and washed twice with water, and the remaining water was removed over magnesium sulfate ($MgSO_4$). The solvent was removed under reduced pressure from the remaining solution, and the residue was subjected to silica column chromatography (eluent; petroleum) to obtain a high-density yellow liquid.

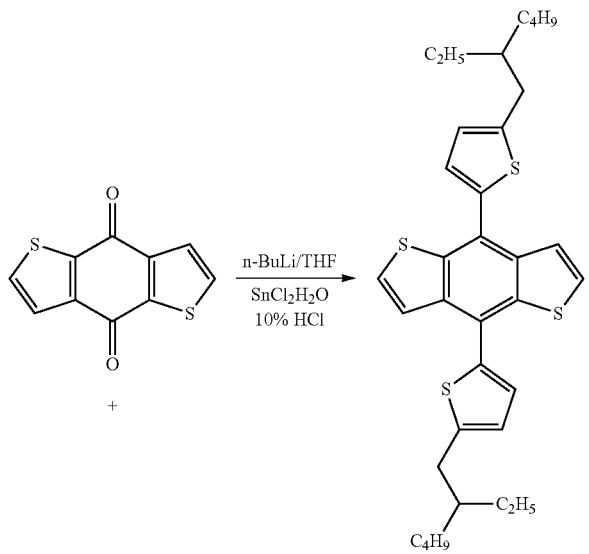

[Chemical Formula C]

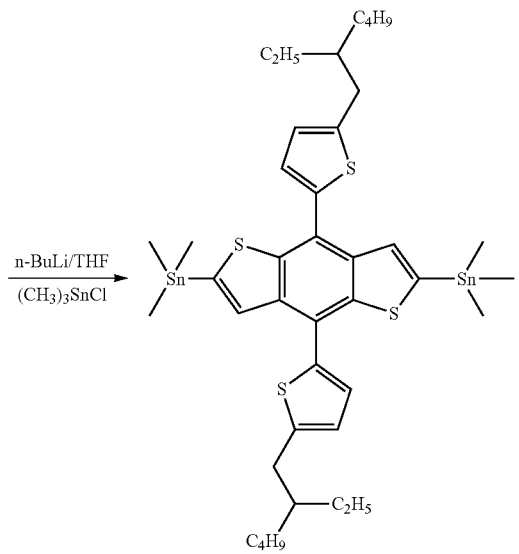

[Chemical Formula C-1]

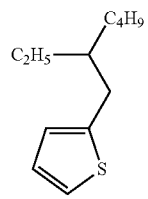

(1) Synthesis of Chemical Formula C 2-(2-ethylhexyl)thiophene (10.0 g, 59.4 mmol) was put into 500 ml of tetrahydrofuran (THF), and dissolved therein, and then the temperature was lowered to −78° C. At this temperature, 2.5 M n-butyllithium (n-BuLi) in hexane (24.0 ml, 59.4 mmol) was slowly put into the solution, and the resulting solution was stirred for 30 minutes. Thereafter, the temperature was increased to 0° C., the solution was stirred in this state for 1 hour, and then 4,8-dehydrobenzo[1,2-b:4,5-b']dithiophene-4,8-dione (3.3 g, 14.8 mmol) was put into the solution at one time, and the resulting solution was stirred at 50° C. for 3 hours. The temperature of the solution was lowered to normal temperature, and then tin(II)chloride dehydrate ($SnCl_2 \cdot 2H_2O$) (26 g) and 10% HCl (56 ml) were Yield: 64%

(2) Synthesis of Chemical Formula C-1

5 (3.9 g, 7.59 mmol) was put into 100 ml of tetrahydrofuran (THF), and dissolved therein, and then the temperature was lowered to 0° C. At this temperature, 1.6 M n-butyllithium (n-BuLi) in hexane (10.4 ml, 16.7 mmol) was slowly put into the solution, and the resulting solution was stirred for 1 hour. 1 M trimethyltinchloride in THF (22.7 ml, 22.7 mmol) was put into the solution at one time, and the resulting solution was stirred for 2 hours. Water was poured into the solution, the solution was extracted twice with diethyl ether, and washed twice with water, and the remaining water was removed over magnesium sulfate ($MgSO_4$). The solvent was removed under reduced pressure from the remaining solution, and the residue was recrystallized with ethanol to obtain a pale yellow crystal solid.

Yield: 87%

Preparation of Polymer

The monomer of each of the first unit to the third unit of the polymer was prepared by using chlorobenzene as a solvent, adding $Pd_2(dba)_3$ and $P(o\text{-}tolyl)_3$ to the solvent, and polymerizing the mixture in a microwave reactor.

Manufacture of Organic Solar Cell and Measurement of Characteristics Thereof

Experimental Example 1. Manufacture-1 of Organic Solar Cell

A composite solution was prepared by dissolving the following Polymer 1 and $PC_{61}BM$ at a ratio of 1:1 in chlorobenzene (CB). In this case, the concentration was adjusted to 2.5 wt %, and the organic solar cell was made to have a structure of ITO/PEDOT:PSS/a photoactive layer/Al. A glass substrate coated with ITO with $1.5*1.5$ cm$^2$ in a bar type was ultrasonically washed using distilled water, acetone, and 2-propanol, the ITO surface was treated with ozone for 10 minutes, and then heat treatment was performed at 235° C. for 5 minutes by spin-coating PEDOT:PSS (AI4083) to have a thickness of 45 nm. For the coating of a photoactive layer, the polymer $PC_{61}BM$ composite solution was spin-coated at 500 rpm, 1,000 rpm, 1,500 rpm, and 2,000 rpm, respectively, for 10 seconds, and Al was deposited to have a thickness of 100 nm at a rate of 1 Å/s by using a thermal evaporator under a vacuum of $3\times10^{-8}$ torr, thereby manufacturing an organic solar cell.

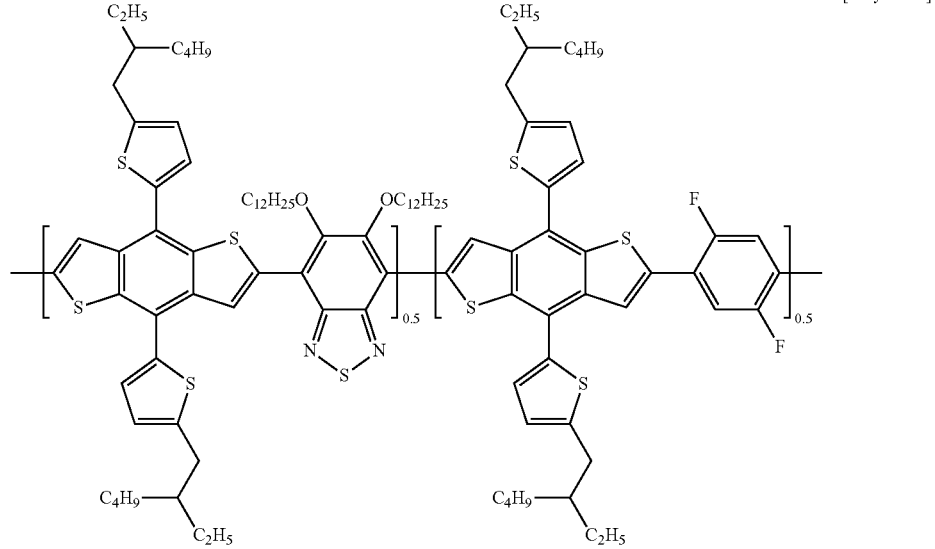

[Polymer 1]

FIG. 6 is a view illustrating an UV-vis absorption spectrum of Polymer 1.

Experimental Example 2. Manufacture-2 of Organic Solar Cell

An organic solar cell was manufactured in the same manner as in Experimental Example 1, except that Polymer 1 and $PC_{61}BM$ were prepared at a ratio of 1:2 in Experimental Example 1.

Experimental Example 3. Manufacture-3 of Organic Solar Cell

An organic solar cell was manufactured in the same manner as in Experimental Example 1, except that Polymer 1 and $PC_{61}BM$ were prepared at a ratio of 1:3 in Experimental Example 1.

The photoelectric conversion characteristics of the organic solar cells manufactured in Experimental Examples 1 to 3 were measured under the condition of 100 mW/cm$^2$ (AM 1.5), and the results are shown in the following Table 1.

TABLE 1

| Active layer Polymer:PC$_{61}$BM | Rpm | V$_{OC}$ (V) | J$_{SC}$ (mA/cm$^2$) | FF (%) | PCE (%) | PCE$_{avg}$ (%) |
|---|---|---|---|---|---|---|
| Experimental Example 1 | 1:1 | 500 | 0.778 | 2.471 | 0.382 | 0.73 | 0.79 |
| | | | 0.808 | 2.663 | 0.418 | 0.9 | |
| | | | 0.806 | 2.415 | 0.372 | 0.73 | |
| | | 1000 | 0.813 | 2.812 | 0.393 | 0.90 | 0.89 |
| | | | 0.798 | 2.901 | 0.383 | 0.89 | |
| | | | 0.803 | 2.798 | 0.397 | 0.89 | |
| | | 1500 | 0.789 | 3.406 | 0.383 | 1.03 | 1.08 |
| | | | 0.791 | 3.666 | 0.403 | 1.17 | |
| | | | 0.789 | 3.461 | 0.380 | 1.04 | |
| | | 2000 | 0.811 | 3.953 | 0.427 | 1.37 | 1.35 |
| | | | 0.768 | 4.097 | 0.411 | 1.29 | |
| | | | 0.806 | 4.031 | 0.430 | 1.40 | |
| Experimental Example 2 | 1:2 | 500 | 0.802 | 3.091 | 0.423 | 1.05 | 1.17 |
| | | | — | — | — | — | |
| | | | 0.799 | 3.554 | 0.456 | 1.29 | |
| | | 1000 | 0.785 | 3.664 | 0.394 | 1.13 | 1.16 |
| | | | 0.780 | 3.900 | 0.397 | 1.21 | |
| | | | 0.776 | 3.795 | 0.393 | 1.16 | |
| | | 1500 | 0.807 | 5.072 | 0.422 | 1.73 | 1.76 |
| | | | 0.808 | 5.23 | 0.441 | 1.86 | |
| | | | 0.807 | 4.998 | 0.418 | 1.69 | |
| | | 2000 | 0.819 | 5.424 | 0.469 | 2.08 | 1.97 |
| | | | 0.795 | 5.673 | 0.438 | 1.97 | |
| | | | 0.784 | 5.748 | 0.410 | 1.85 | |
| Experimental Example 3 | 1:3 | 500 | 0.785 | 3.265 | 0.438 | 1.12 | 0.8 |
| | | | 0.769 | 1.722 | 0.380 | 0.5 | |
| | | | 0.787 | 2.297 | 0.433 | 0.78 | |
| | | 1000 | 0.778 | 2.471 | 0.382 | 0.73 | 0.79 |
| | | | 0.808 | 2.663 | 0.418 | 0.90 | |
| | | | 0.806 | 2.415 | 0.372 | 0.73 | |
| | | 1500 | 0.814 | 4.833 | 0.453 | 1.78 | 1.74 |
| | | | 0.784 | 4.944 | 0.417 | 1.62 | |
| | | | 0.810 | 4.815 | 0.465 | 1.81 | |
| | | 2000 | 0.816 | 4.737 | 0.489 | 1.89 | 1.92 |
| | | | 0.803 | 4.927 | 0.484 | 1.91 | |
| | | | 0.807 | 4.928 | 0.488 | 1.94 | |

FIG. 10 is a view illustrating the current density according to the voltage of an organic solar cell according to the rpm of Experimental Example 1.

FIG. 11 is a view illustrating the current density according to the voltage of an organic solar cell according to the rpm of Experimental Example 2.

FIG. 12 is a view illustrating the current density according to the voltage of an organic solar cell according to the rpm of Experimental Example 3.

Experimental Example 4. Manufacture-4 of Organic Solar Cell

An organic solar cell was manufactured in the same manner as in Experimental Example 2, except that when Polymer 1 and PC$_{61}$BM were spin-coated at 1,500 rpm, and then each were not annealed, heat treatment was performed at 80° C., 130° C., and 200° C. in Experimental Example 2.

Experimental Example 5. Manufacture-5 of Organic Solar Cell

An organic solar cell was manufactured in the same manner as in Experimental Example 4, except that when Polymer 1 and PC$_{61}$BM were spin-coated at 1,500 rpm, and then each were not annealed, heat treatment was performed at 100° C., 150° C., and 250° C. in Experimental Example 4.

Experimental Example 6. Manufacture-6 of Organic Solar Cell

An organic solar cell was manufactured in the same manner as in Experimental Example 4, except that when Polymer 1 and PC$_{61}$BM were spin-coated at 2,000 rpm, and then each were not annealed, heat treatment was performed at 80° C., 130° C., and 200° C. in Experimental Example 4.

Experimental Example 7. Manufacture-7 of Organic Solar Cell

An organic solar cell was manufactured in the same manner as in Experimental Example 6, except that when Polymer 1 and PC$_{61}$BM were spin-coated at 2,000 rpm, and then each were not annealed, heat treatment was performed at 100° C., 150° C., and 250° C. in Experimental Example 6.

The photoelectric conversion characteristics of the organic solar cells manufactured in Experimental Examples 4 to 7 were measured under the condition of 100 mW/cm$^2$ (AM 1.5), and the results are shown in the following Table 2.

TABLE 2

| | Active layer | | | | | | |
|---|---|---|---|---|---|---|---|
| | Polymer:PC$_{61}$BM | Annealing (° C.) | $V_{OC}$ (V) | $J_{SC}$ (mA/cm$^2$) | FF (%) | PCE (%) | PCE$_{avg}$ (%) |
| Experimental Example 4 | 1:2 | — | 0.807 | 5.072 | 0.422 | 1.73 | 1.76 |
| | | | 0.808 | 5.23 | 0.441 | 1.86 | |
| | | | 0.807 | 4.998 | 0.418 | 1.69 | |
| | | 80 | 0.873 | 4.825 | 0.426 | 1.8 | 1.82 |
| | | | 0.873 | 4.952 | 0.446 | 1.93 | |
| | | | 0.871 | 4.731 | 0.423 | 1.74 | |
| | | 130 | 0.802 | 5.004 | 0.438 | 1.76 | 1.77 |
| | | | 0.802 | 5.146 | 0.453 | 1.87 | |
| | | | 0.805 | 4.937 | 0.426 | 1.69 | |
| | | 200 | 0.816 | 3.507 | 0.402 | 1.15 | 1.13 |
| | | | 0.806 | 3.552 | 0.405 | 1.16 | |
| | | | 0.807 | 3.384 | 0.392 | 1.07 | |
| Experimental Example 5 | 1:2 | — | 0.819 | 5.424 | 0.469 | 2.08 | 1.97 |
| | | | 0.795 | 5.673 | 0.438 | 1.97 | |
| | | | 0.784 | 5.748 | 0.410 | 1.85 | |
| | | 100 | 0.861 | 5.196 | 0.458 | 2.05 | 2.00 |
| | | | 0.847 | 5.380 | 0.446 | 2.03 | |
| | | | 0.838 | 5.471 | 0.418 | 1.92 | |
| | | 150 | 0.759 | 5.223 | 0.459 | 1.82 | 1.84 |
| | | | 0.743 | 5.341 | 0.440 | 1.75 | |
| | | | 0.756 | 5.489 | 0.470 | 1.95 | |
| | | 250 | 0.352 | 3.109 | 0.407 | 0.45 | 0.42 |
| | | | 0.315 | 3.140 | 0.380 | 0.38 | |
| | | | 0.336 | 3.219 | 0.397 | 0.43 | |
| Experimental Example 6 | 1:3 | — | 0.814 | 4.833 | 0.453 | 1.78 | 1.74 |
| | | | 0.784 | 4.944 | 0.417 | 1.62 | |
| | | | 0.810 | 4.815 | 0.465 | 1.81 | |
| | | 80 | 0.874 | 4.557 | 0.448 | 1.78 | 1.81 |
| | | | 0.872 | 4.675 | 0.476 | 1.94 | |
| | | | 0.866 | 4.505 | 0.440 | 1.73 | |
| | | 130 | 0.769 | 4.5 | 0.447 | 1.55 | 1.61 |
| | | | 0.772 | 4.57 | 0.475 | 1.71 | |
| | | | 0.770 | 4.534 | 0.454 | 1.58 | |
| | | 200 | 0.774 | 2.962 | 0.421 | 0.96 | 0.99 |
| | | | 0.767 | 3.114 | 0.422 | 1.01 | |
| | | | 0.778 | 3.065 | 0.419 | 1.00 | |
| Experimental Example 7 | 1:3 | — | 0.816 | 4.737 | 0.489 | 1.89 | 1.92 |
| | | | 0.803 | 4.927 | 0.484 | 1.91 | |
| | | | 0.807 | 4.928 | 0.488 | 1.94 | |
| | | 100 | 0.851 | 4.434 | 0.479 | 1.81 | 1.85 |
| | | | 0.845 | 4.652 | 0.480 | 1.89 | |
| | | | 0.845 | 4.640 | 0.472 | 1.85 | |
| | | 150 | 0.744 | 4.175 | 0.470 | 1.46 | 1.52 |
| | | | 0.736 | 4.466 | 0.481 | 1.58 | |
| | | | 0.738 | 4.437 | 0.466 | 1.53 | |
| | | 250 | 0.334 | 1.916 | 0.398 | 0.26 | 0.22 |
| | | | 0.299 | 1.921 | 0.365 | 0.21 | |
| | | | 0.303 | 1.916 | 0.342 | 0.20 | |

Experimental Example 8. Manufacture-8 of Organic Solar Cell

A composite solution was prepared by dissolving the following Polymer 2 and PC$_{61}$BM at a ratio of 1:1 in chlorobenzene (CB). In this case, the concentration was adjusted to 2.5 wt %, and the organic solar cell was made to have a structure of ITO/PEDOT:PSS/a photoactive layer/Al. A glass substrate coated with ITO with 1.5*1.5 cm$^2$ in a bar type was ultrasonically washed using distilled water, acetone, and 2-propanol, the ITO surface was treated with ozone for 10 minutes, and then PEDOT:PSS (AI4083) was spin-coated to have a thickness of 45 nm at 4,000 rpm for 40 seconds, and heat treatment was performed at 235° C. for 10 minutes. For the coating of a photoactive layer, the polymer PC$_{61}$BM composite solution was spin-coated at 500 rpm, 1,000 rpm, 1,500 rpm, and 2,000 rpm, respectively, for 10 seconds, and Al was deposited to have a thickness of 100 nm at a rate of 1 Å/s by using a thermal evaporator under a vacuum of 3×10$^{-8}$ torr, thereby manufacturing an organic solar cell.

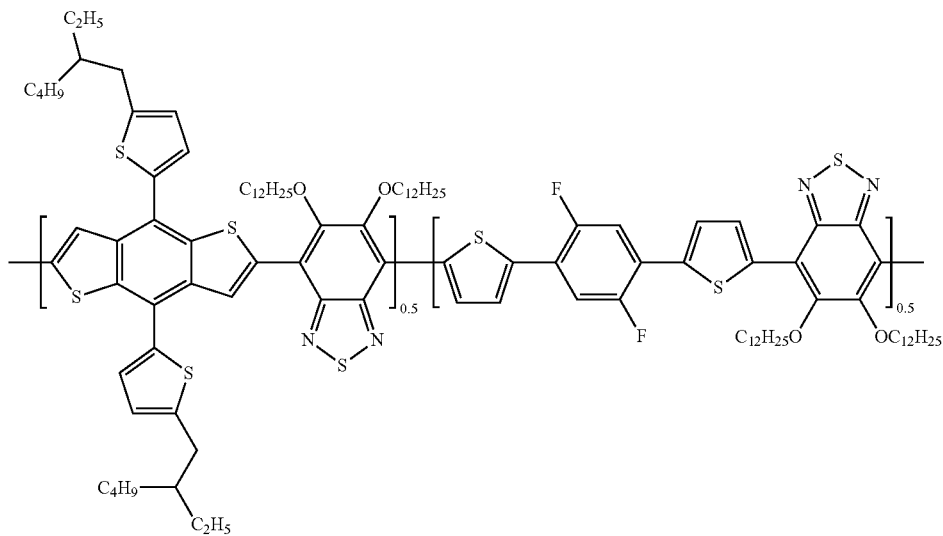

[Polymer 2]

FIG. 7 is a view illustrating a UV-vis absorption spectrum of Polymer 2.

Experimental Example 9. Manufacture-9 of Organic Solar Cell

An organic solar cell was manufactured in the same manner as in Experimental Example 8, except that Polymer 2 and $PC_{61}BM$ were prepared at a ratio of 1:2 in Experimental Example 8.

Experimental Example 10. Manufacture-10 of Organic Solar Cell

An organic solar cell was manufactured in the same manner as in Experimental Example 8, except that Polymer 2 and $PC_{61}BM$ were prepared at a ratio of 1:3 in Experimental Example 8.

Experimental Example 11. Manufacture-11 of Organic Solar Cell

An organic solar cell was manufactured in the same manner as in Experimental Example 8, except that Polymer 2 and $PC_{61}BM$ were prepared at a ratio of 1:2 and the concentration was adjusted to 4.0 wt % in Experimental Example 8.

The photoelectric conversion characteristics of the organic solar cells manufactured in Experimental Examples 8 to 11 were measured under the condition of 100 $mW/cm^2$ (AM 1.5), and the results are shown in the following Table 3.

TABLE 3

| | Active layer | | $V_{OC}$ | $J_{SC}$ | FF | PCE | $PCE_{avg}$ |
| | Polymer:$PC_{61}BM$ | rpm | (V) | (mA/$cm^2$) | (%) | (%) | (%) |
|---|---|---|---|---|---|---|---|
| Experimental Example 8 | 1:1 (2.5 wt %) | 500 | 0.713 | 4.866 | 0.357 | 1.24 | 1.37 ± 0.12 |
| | | | 0.718 | 5.485 | 0.373 | 1.47 | |
| | | | 0.724 | 5.182 | 0.374 | 1.40 | |
| | | 1000 | 0.724 | 6.061 | 0.401 | 1.76 | 1.85 ± 0.08 |
| | | | 0.714 | 6.632 | 0.403 | 1.91 | |
| | | | 0.720 | 6.608 | 0.395 | 1.88 | |
| | | 1500 | 0.742 | 7.523 | 0.393 | 2.2 | 2.27 ± 0.07 |
| | | | 0.732 | 8.023 | 0.395 | 2.32 | |
| | | | 0.731 | 8.034 | 0.390 | 2.29 | |
| | | 2000 | 0.746 | 8.688 | 0.400 | 2.6 | 2.38 ± 0.25 |
| | | | 0.726 | 8.457 | 0.396 | 2.43 | |
| | | | 0.698 | 8.271 | 0.364 | 2.1 | |
| Experimental Example 9 | 1:2 (2.5 wt %) | 500 | 0.768 | 3.974 | 0.458 | 1.4 | 1.31 ± 0.12 |
| | | | 0.781 | 3.56 | 0.441 | 1.22 | |
| | | 1000 | 0.765 | 5.293 | 0.588 | 2.29 | 2.21 ± 0.1 |
| | | | 0.748 | 5.04 | 0.557 | 2.1 | |
| | | | 0.761 | 5.298 | 0.554 | 2.23 | |
| | | 1500 | 0.794 | 7.329 | 0.588 | 3.42 | 3.39 ± 0.15 |
| | | | 0.78 | 7.151 | 0.58 | 3.23 | |
| | | | 0.793 | 7.474 | 0.595 | 3.52 | |
| | | 2000 | 0.797 | 7.289 | 0.587 | 3.41 | 3.26 ± 0.15 |
| | | | 0.786 | 6.815 | 0.58 | 3.1 | |
| | | | 0.793 | 6.902 | 0.597 | 3.27 | |

TABLE 3-continued

| Active layer | | | $V_{OC}$ | $J_{SC}$ | FF | PCE | $PCE_{avg}$ |
|---|---|---|---|---|---|---|---|
| Polymer:$PC_{61}BM$ | | rpm | (V) | (mA/cm$^2$) | (%) | (%) | (%) |
| Experimental Example 10 | 1:3 (2.5 wt %) | 500 | 0.782 | 5.022 | 0.511 | 2.01 | 2.09 ± 0.18 |
| | | | 0.763 | 4.623 | 0.555 | 1.96 | |
| | | | 0.791 | 5.766 | 0.503 | 2.29 | |
| | | 1000 | 0.8 | 4.835 | 0.6 | 2.32 | 2.46 ± 0.38 |
| | | | 0.81 | 5.633 | 0.637 | 2.90 | |
| | | | 0.793 | 4.567 | 0.599 | 2.17 | |
| | | 1500 | 0.808 | 5.694 | 0.633 | 2.91 | 2.9 ± 0.25 |
| | | | 0.798 | 5.959 | 0.606 | 2.88 | |
| | | 2000 | 0.812 | 0.633 | 0.616 | 2.87 | 2.96 ± 0.42 |
| | | | 0.805 | 0.606 | 0.605 | 3.05 | |
| Experimental Example 11 | 1:2 (4.0 wt %) | 500 | 0.797 | 5.59 | 0.448 | 2 | 2.01 ± 0.19 |
| | | | 0.791 | 6.102 | 0.455 | 2.19 | |
| | | | 0.79 | 5.107 | 0.452 | 1.82 | |
| | | 1000 | 0.758 | 6.508 | 0.522 | 2.57 | 2.55 ± 0.03 |
| | | | 0.753 | 6.335 | 0.529 | 2.53 | |
| | | 1500 | 0.797 | 6.603 | 0.568 | 2.99 | 3.17 ± 0.2 |
| | | | 0.784 | 6.929 | 0.575 | 3.12 | |
| | | | 0.795 | 7.602 | 0.562 | 3.39 | |
| | | 2000 | 0.788 | 6.664 | 0.574 | 3.02 | 3.02 |

Experimental Example 12. Manufacture-12 of Organic Solar Cell

An organic solar cell was manufactured in the same manner as in Experimental Example 9, except that Polymer 2 and $PC_{61}BM$ were spin-coated at 1,500 rpm, and then heat treatment was performed at 80° C. in Experimental Example 9.

Experimental Example 13. Manufacture-13 of Organic Solar Cell

An organic solar cell was manufactured in the same manner as in Experimental Example 9, except that Polymer 2 and $PC_{61}BM$ were spin-coated at 2000 rpm, and then heat treatment was performed at 100° C. in Experimental Example 9.

Experimental Example 14. Manufacture-14 of Organic Solar Cell

An organic solar cell was manufactured in the same manner as in Experimental Example 11, except that Polymer 2 and $PC_{61}BM$ were spin-coated at 1500 rpm, and then heat treatment was performed at 120° C. in Experimental Example 11.

Experimental Example 15. Manufacture-15 of Organic Solar Cell

An organic solar cell was manufactured in the same manner as in Experimental Example 11, except that Polymer 2 and $PC_{61}BM$ were spin-coated at 2000 rpm, and then heat treatment was performed at 140° C. in Experimental Example 11.

The photoelectric conversion characteristics of the organic solar cells manufactured in Experimental Examples 12 to 15 were measured under the condition of 100 mW/cm$^2$ (AM 1.5), and the results are shown in the following Table 4.

TABLE 4

| | Active layer | | $V_{OC}$ | $J_{SC}$ | FF | PCE | $PCE_{avg}$ |
|---|---|---|---|---|---|---|---|
| | rpm | Annealing (° C.) | (V) | (mA/cm$^2$) | (%) | (%) | (%) |
| Experimental Example 12 | 1500 | 80 | 0.863 | 7.321 | 0.592 | 3.74 | 3.63 ± 0.14 |
| | | | 0.849 | 7.002 | 0.583 | 3.47 | |
| | | | 0.858 | 7.244 | 0.591 | 3.67 | |
| Experimental Example 13 | 2000 | 100 | 0.867 | 6.883 | 0.589 | 3.52 | 3.33 ± 0.16 |
| | | | 0.856 | 6.358 | 0.59 | 3.21 | |
| | | | 0.859 | 6.497 | 0.584 | 3.26 | |
| Experimental Example 14 | 1500 | 120 | 0.849 | 6.045 | 0.565 | 2.9 | 3.03 ± 0.13 |
| | | | 0.841 | 6.297 | 0.569 | 3.01 | |
| | | | 0.842 | 6.832 | 0.55 | 3.16 | |
| Experimental Example 15 | 2000 | 140 | 0.843 | 5.959 | 0.552 | 2.77 | 2.77 |

Experimental Example 16. Manufacture-16 of Organic Solar Cell

A composite solution was prepared by dissolving the following Polymer 3 prepared in the Preparation Example 5 and $PC_{61}BM$ at a ratio of 1:2 in chlorobenzene (CB). In this case, the concentration was adjusted to 2.5 wt %, and the organic solar cell was made to have a structure of ITO/PEDOT:PSS/a photoactive layer/Al. A glass substrate coated with ITO with 1.5*1.5 cm² in a bar type was ultrasonically washed using distilled water, acetone, and 2-propanol, the ITO surface was treated with ozone for 10 minutes, and then PEDOT:PSS (AI4083) was spin-coated to have a thickness of 45 nm at 4,000 rpm for 40 seconds, and heat treatment was performed at 235° C. for 10 minutes. For the coating of a photoactive layer, the polymer $PC_{61}BM$ composite solution was spin-coated at 500 rpm, 1,000 rpm, 1,500 rpm, and 2,000 rpm, respectively, for 10 seconds, and Al was deposited to have a thickness of 100 nm at a rate of 1 Å/s by using a thermal evaporator under a vacuum of $3 \times 10^{-8}$ torr, thereby manufacturing an organic solar cell.

[Polymer 3]

FIG. 8 is a view illustrating a UV-vis absorption spectrum of Polymer 3.

The physical properties of Polymer 3 are as follows.

| LUMO | HOMO | Band gap | Mn | Mw | PDI |
|------|------|----------|-------|-------|------|
| 3.54 | 5.49 | 1.95 (f) 1.96 (s) | 69280 | 96221 | 1.38 |

Experimental Example 17. Manufacture-17 of Organic Solar Cell

An organic solar cell was manufactured in the same manner as in Experimental Example 16, except that the following Polymer 4 and $PC_{61}BM$ were prepared at a ratio of 1:2 instead of Polymer 3, and the concentration was adjusted to 4 wt % in Experimental Example 16.

[Polymer 4]

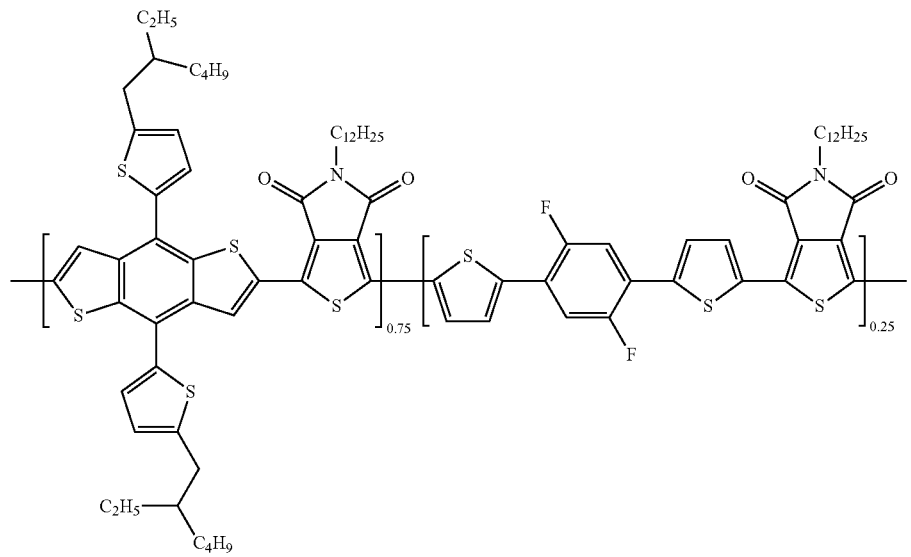

FIG. 9 is a view illustrating a UV-vis absorption spectrum of Polymer 4.

The physical properties of Polymer 4 are as follows.

| LUMO | HOMO | Band gap | Mn | Mw | PDI |
|---|---|---|---|---|---|
| 3.69 | 5.58 | 1.89(f) | 36854 | 55640 | 1.51 |

The photoelectric conversion characteristics of the organic solar cells manufactured in Experimental Examples 16 and 17 were measured under the condition of 100 mW/cm² (AM 1.5), and the results are shown in the following Table 5.

TABLE 5

| | Active layer | | $V_{OC}$ | $J_{SC}$ | FF | PCE | $PCE_{avg}$ |
|---|---|---|---|---|---|---|---|
| | Polymer:PC$_{61}$BM | rpm | (V) | (mA/cm²) | (%) | (%) | (%) |
| Experimental Example 16 | 1:2 (2.5 wt %) | 500 | 0.951 | 11.12 | 0.503 | 5.319 | 4.92 |
| | | | 0.945 | 9.784 | 0.488 | 4.513 | |
| | | 1000 | 0.975 | 8.588 | 0.622 | 5.217 | 5.05 |
| | | | 0.967 | 8.969 | 0.609 | 5.282 | |
| | | | 0.95 | 7.919 | 0.618 | 4.65 | |
| | | 1500 | 0.952 | 9.058 | 0.622 | 5.372 | 5.4 |
| | | | 0.957 | 9.142 | 0.619 | 5.421 | |
| | | 2000 | 0.946 | 8.684 | 0.609 | 5.005 | 4.96 |
| | | | 0.942 | 8.52 | 0.61 | 4.897 | |
| | | | 0.946 | 8.641 | 0.607 | 4.966 | |
| Experimental Example 17 | 1:2 (4 wt %) | 1000 | 0.918 | 11.72 | 0.61 | 6.56 | 6.75 ± 0.2 |
| | | | 0.915 | 11.303 | 0.643 | 6.65 | |
| | | | 0.915 | 12.17 | 0.631 | 7.02 | |
| | | 700 | 0.914 | 12.146 | 0.585 | 6.49 | 6.57 ± 0.17 |
| | | | 0.911 | 12.372 | 0.605 | 6.82 | |
| | | | 0.908 | 12.103 | 0.584 | 6.41 | |
| | | 1500 | 0.9 | 9.319 | 0.639 | 5.35 | 5.56 ± 0.14 |
| | | | 0.91 | 9.244 | 0.674 | 5.67 | |
| | | | 0.91 | 9.334 | 0.663 | 5.64 | |

Experimental Example 18. Manufacture-18 of Organic Solar Cell

An organic solar cell was manufactured in the same manner as in Experimental Example 17, except that 3 vol % of diphenylether (DPE) was added to the composite solution prepared at a ratio of the following Polymer 4 and $PC_{71}BM$ of 1:1.5 in Experimental Example 17.

TABLE 6

| | Active layer | | $V_{OC}$ | $J_{SC}$ | FF | PCE | |
|---|---|---|---|---|---|---|---|
| | Polymer:$PC_{61}$BM | Additive | (V) | (mA/cm$^2$) | (%) | (%) | Cal · $J_{sc}$ |
| Experimental Example 18 | 1:1.5 | — | 0.87 | 10.01 | 0.69 | 6.01 | 9.81 |
| | | DPE | 0.88 | 14.51 | 0.65 | 8.25 | 14.03 |
| | | DPE | 0.87 | 12.39 | 0.72 | 7.68 | 11.52 |

FIG. 13 is a view illustrating the current density according to the voltage of an organic solar cell according to Experimental Example 18.

FIG. 14 is a view illustrating the incident photoelectric conversion efficiency of the organic solar cell of Experimental Example 18.

A glass substrate coated with ITO with 1.5*1.5 cm$^2$ in a bar type was ultrasonically washed using distilled water, acetone, and 2-propanol, the ITO surface was treated with ozone for 10 minutes, and then PEDOT:PSS (AI4083) was spin-coated to have a thickness of 45 nm at 4,000 rpm for 40 seconds, and heat treatment was performed at 235° C. for 10 minutes. For the coating of a photoactive layer, the polymer $PC_{61}BM$ composite solution was spin-coated at 500 rpm, 1,000 rpm, 1,500 rpm, and 2,000 rpm, respectively, for 10 seconds, and Al was deposited to have a thickness of 100 nm at a rate of 1 Å/s by using a thermal evaporator under a vacuum of 3×10$^{-8}$ torr, thereby manufacturing an organic solar cell.

[Polymer 5]

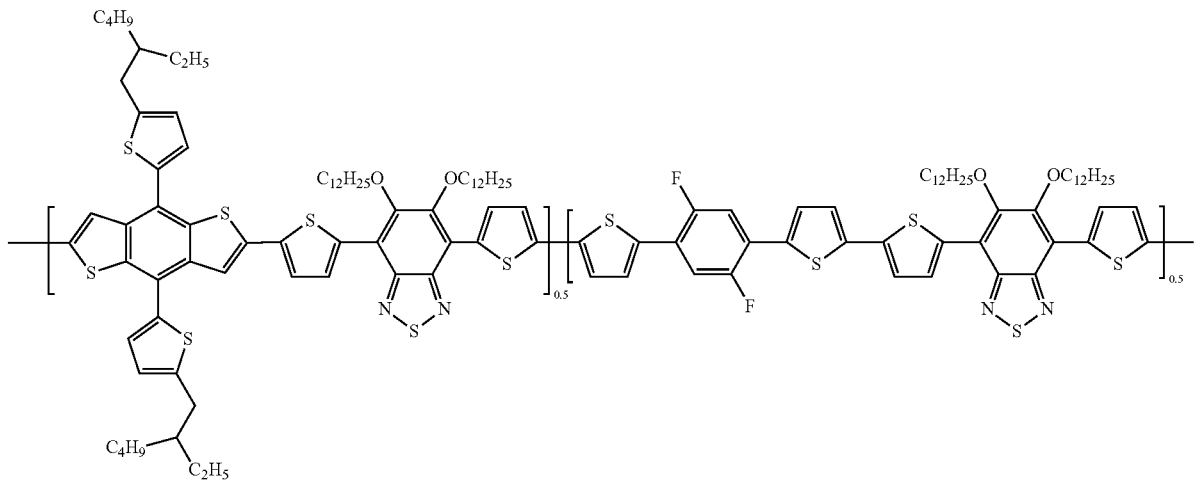

In FIGS. 13 and 14, thick means that the photoactive layer was coated to have a thickness of 230 nm, and thin means that the photoactive layer was coated to have a thickness of 100 to 120 nm.

The physical properties of Polymer 5 are as follows.

| LUMO | HOMO | Band gap | Mn | Mw | PDI |
|---|---|---|---|---|---|
| 3.58 | 5.37 | 1.81(s) 1.79(f) | 31298 | 52414 | 1.67 |

Experimental Example 19. Manufacture-19 of Organic Solar Cell

A composite solution was prepared by dissolving the following Polymer 5 and $PC_{61}BM$ at a ratio of 1:3 in chlorobenzene (CB). In this case, the concentration was adjusted to 2.5 wt %, and the organic solar cell was made to have a structure of ITO/PEDOT:PSS/a photoactive layer/Al.

Experimental Example 20. Manufacture-20 of Organic Solar Cell

An organic solar cell was manufactured in the same manner as in Experimental Example 19, except that Polymer 5 and $PC_{61}BM$ were prepared at a ratio of 1:2 in Experimental Example 19.

Experimental Example 21. Manufacture-21 of Organic Solar Cell

An organic solar cell was manufactured in the same manner as in Experimental Example 19, except that Polymer 5 and $PC_{61}BM$ were prepared at a ratio of 1:3 in Experimental Example 19.

Experimental Example 22. Manufacture-22 of Organic Solar Cell

An organic solar cell was manufactured in the same manner as in Experimental Example 19, except that Polymer 5 and $PC_{61}BM$ were prepared at a ratio of 1:2 and the concentration was adjusted to 4 wt % in Experimental Example 19.

The photoelectric conversion characteristics of the organic solar cells manufactured in Experimental Examples 19 to 22 were measured under the condition of 100 mW/cm² (AM 1.5), and the results are shown in the following Table 7.

FIG. 15 is a view illustrating the current density according to the voltage of organic solar cells according to Experimental Examples 19 to 22.

Experimental Example 23. Manufacture-23 of Organic Solar Cell

An organic solar cell was manufactured in the same manner as in Experimental Example 20, except that Polymer 5 and $PC_{61}BM$ were spin-coated at 1,000 rpm, and then heat treatment was performed at 120° C. in Experimental Example 20.

Experimental Example 24. Manufacture-24 of Organic Solar Cell

An organic solar cell was manufactured in the same manner as in Experimental Example 20, except that Polymer 5 and $PC_{61}BM$ were spin-coated at 1,500 rpm, and then heat treatment was performed at 100° C. in Experimental Example 20.

TABLE 7

| | Active layer | | $V_{OC}$ | $J_{SC}$ | FF | PCE | $PCE_{avg}$ |
|---|---|---|---|---|---|---|---|
| | Polymer:$PC_{61}BM$ | Rpm | (V) | (mA/cm²) | (%) | (%) | (%) |
| Experimental Example 19 | 1:1 (2.5 wt %) | 700 | 0.663 | 7.876 | 0.374 | 1.95 | 1.92 ± 0.04 |
| | | | 0.658 | 7.506 | 0.38 | 1.88 | |
| | | | 0.657 | 7.838 | 0.377 | 1.94 | |
| | | 1000 | 0.659 | 7.878 | 0.45 | 2.34 | 2.47 ± 0.13 |
| | | | 0.654 | 8.289 | 0.481 | 2.61 | |
| | | | 0.654 | 8.294 | 0.455 | 2.47 | |
| | | 1500 | 0.673 | 8.542 | 0.488 | 2.8 | 2.86 ± 0.13 |
| | | | 0.67 | 9.172 | 0.49 | 3.01 | |
| | | | 0.665 | 9.128 | 0.456 | 2.77 | |
| | | 2000 | 0.681 | 9.846 | 0.49 | 3.29 | 3.31 ± 0.01 |
| | | | 0.676 | 9.774 | 0.506 | 3.34 | |
| | | | 0.118 | 8.605 | 0.263 | 0.27 | |
| Experimental Example 20 | 1:2 (2.5 wt %) | 700 | 0.649 | 9.84 | 0.492 | 3.15 | 3.26 ± 0.13 |
| | | | 0.645 | 10.272 | 0.489 | 3.24 | |
| | | | 0.643 | 10.621 | 0.499 | 3.41 | |
| | | 1000 | 0.644 | 8.754 | 0.538 | 3.03 | 3.01 ± 0.07 |
| | | | 0.64 | 8.987 | 0.532 | 3.06 | |
| | | | 0.638 | 9.176 | 0.501 | 2.93 | |
| | | 1500 | 0.661 | 9.532 | 0.604 | 3.8 | 3.97 ± 0.14 |
| | | | 0.659 | 9.897 | 0.621 | 4.05 | |
| | | | 0.657 | 9.954 | 0.618 | 4.04 | |
| | | 2000 | 0.668 | 9.813 | 0.648 | 4.25 | 4.01 ± 0.23 |
| | | | 0.663 | 9.274 | 0.651 | 4.00 | |
| | | | 0.663 | 8.889 | 0.642 | 3.78 | |
| Experimental Example 21 | 1:3 (2.5 wt %) | 700 | 0.649 | 8.979 | 0.533 | 3.11 | 3.19 ± 0.07 |
| | | | 0.644 | 9.358 | 0.533 | 3.21 | |
| | | | 0.643 | 9.251 | 0.547 | 3.25 | |
| | | 1000 | 0.646 | 8.232 | 0.597 | 3.17 | 3.12 ± 0.07 |
| | | | 0.641 | 8.177 | 0.602 | 3.15 | |
| | | | 0.64 | 7.783 | 0.61 | 3.04 | |
| | | 1500 | 0.662 | 8.939 | 0.655 | 3.87 | 3.83 ± 0.05 |
| | | | 0.658 | 8.674 | 0.673 | 3.84 | |
| | | | 0.655 | 8.73 | 0.659 | 3.77 | |
| | | 2000 | 0.665 | 9.061 | 0.678 | 4.09 | 3.7 ± 0.33 |
| | | | 0.658 | 7.812 | 0.692 | 3.56 | |
| | | | 0.658 | 7.684 | 0.684 | 3.46 | |
| Experimental Example 22 | 1:2 (4 wt %) | 700 | 0.634 | 9.884 | 0.436 | 2.73 | 2.75 ± 0.03 |
| | | | 0.63 | 10.23 | 0.424 | 2.73 | |
| | | | 0.628 | 10.457 | 0.424 | 2.78 | |
| | | 1000 | 0.64 | 11.141 | 0.455 | 3.25 | 3.2 ± 0.16 |
| | | | 0.635 | 11.215 | 0.467 | 3.33 | |
| | | | 0.63 | 10.503 | 0.456 | 3.02 | |
| | | 1500 | 0.643 | 10.449 | 0.459 | 3.08 | 3.07 ± 0.02 |
| | | | 0.634 | 10.217 | 0.47 | 3.05 | |
| | | | 0.635 | 10.382 | 0.469 | 3.09 | |
| | | 2000 | 0.637 | 9.352 | 0.485 | 2.89 | 2.93 ± 0.05 |
| | | | 0.63 | 9.567 | 0.496 | 2.99 | |

Experimental Example 25. Manufacture-25 of Organic Solar Cell

An organic solar cell was manufactured in the same manner as in Experimental Example 20, except that Polymer 5 and $PC_{61}BM$ were spin-coated at 2,000 rpm, and then heat treatment was performed at 80° C. in Experimental Example 20.

The photoelectric conversion characteristics of the organic solar cells manufactured in Experimental Examples 23 to 25 were measured under the condition of 100 mW/cm$^2$ (AM 1.5), and the results are shown in the following Table 8.

TABLE 8

| | Active layer | | | | | | |
|---|---|---|---|---|---|---|---|
| | rpm | Annealing (° C.) | $V_{OC}$ (V) | $J_{SC}$ (mA/cm$^2$) | FF (%) | PCE (%) | $PCE_{avg}$ (%) |
| Experimental Example 23 | 1000 | 120 | 0.696 | 7.293 | 0.556 | 2.82 | 2.85 ± 0.06 |
| | | | 0.693 | 7.495 | 0.56 | 2.91 | |
| | | | 0.69 | 7.575 | 0.537 | 2.81 | |
| Experimental Example 24 | 1500 | 100 | 0.705 | 8.567 | 0.607 | 3.67 | 3.8 ± 0.12 |
| | | | 0.704 | 8.958 | 0.618 | 3.9 | |
| | | | 0.703 | 8.914 | 0.613 | 3.84 | |
| Experimental Example 25 | 2000 | 80 | 0.7 | 9.138 | 0.644 | 4.12 | 3.9 ± 0.22 |
| | | | 0.698 | 8.647 | 0.647 | 3.9 | |
| | | | 0.698 | 8.263 | 0.638 | 3.68 | |

Comparative Example 1. Manufacture of Organic Solar Cell

A composite solution was prepared by dissolving the following Polymer 6 and $PC_{61}BM$ at a ratio of 1:1 in chlorobenzene (CB). In this case, the concentration was adjusted to 2.5 wt %, and the organic solar cell was made to have a structure of ITO/PEDOT:PSS/a photoactive layer/Al. A glass substrate coated with ITO with 1.5*1.5 cm$^2$ in a bar type was ultrasonically washed using distilled water, acetone, and 2-propanol, the ITO surface was treated with ozone for 10 minutes, and then heat treatment was performed at 235° C. for 5 minutes by spin-coating PEDOT:PSS (AI4083) to have a thickness of 45 nm. For the coating of a photoactive layer, the polymer $PC_{61}BM$ composite solution was spin-coated for 10 seconds, and Al was deposited to have a thickness of 100 nm at a rate of 1 Å/s by using a thermal evaporator under a vacuum of $3 \times 10^{-8}$ torr, thereby manufacturing an organic solar cell.

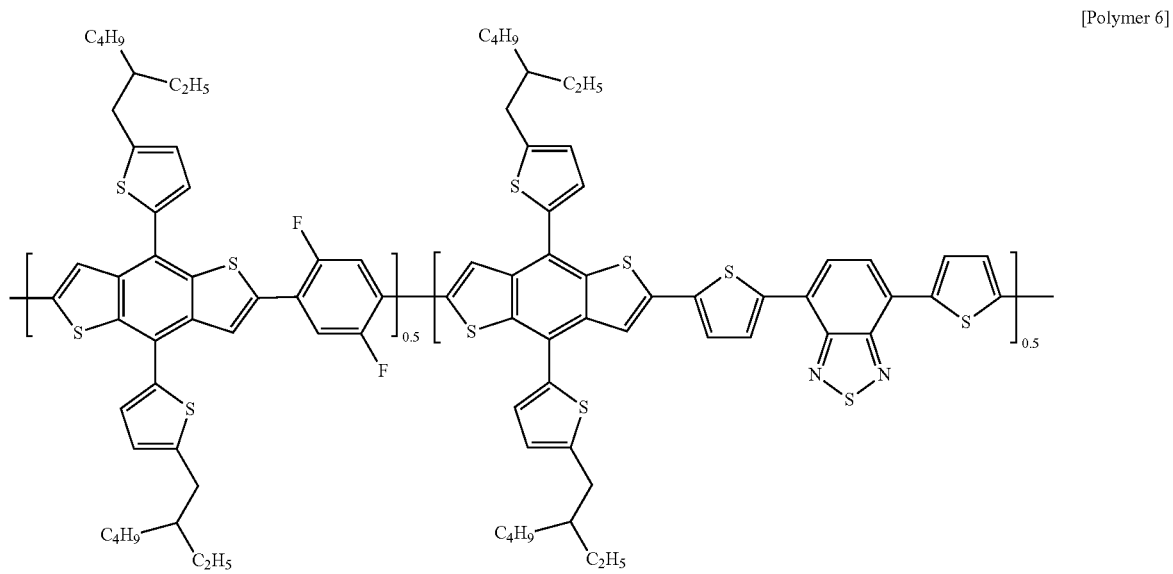

[Polymer 6]

The photoelectric conversion characteristics of the organic solar cell manufactured in Comparative Example 1 were measured under the condition of mW/cm$^2$ (AM 1.5), and the results are shown in the following Table 9.

TABLE 9

| | $V_{oc}$ (V) | $J_{sc}$ (mA/cm$^2$) | FF (%) | PCE (%) |
|---|---|---|---|---|
| Comparative Example 1 | 0.628 | 1.017 | 0.610 | 0.39 |

$V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the width of a rectangle, which may be drawn inside the curve, by the product of the short-circuit current and the open-circuit voltage. The energy conversion efficiency may be obtained when these three values are divided by the intensity of the irradiated light, and the higher value is preferred.

From the result of Table 9, it can be confirmed that according to an exemplary embodiment of the present specification, when the third unit represented by Chemical Formula 3 includes R20 and R21, a device with high open-circuit voltage and high efficiency may be provided.

This is because O atoms of R20 and R21; A1 and A2 of the first unit represented by Chemical Formula 1; and an S atom of the second unit represented by Chemical Formula 2 interact with each other to form a planar structure.

The invention claimed is:

1. A polymer comprising:
  a first unit represented by the following Chemical Formula 1;
  a second unit represented by the following Chemical Formula 2; and
  a third unit represented by the following Chemical Formula 3 or 4:

[Chemical Formula 1]

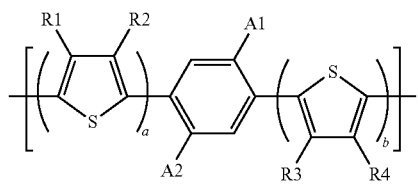

[Chemical Formula 2]

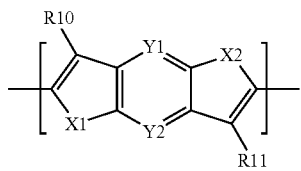

[Chemical Formula 3]

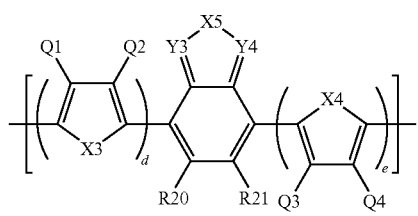

[Chemical Formula 4]

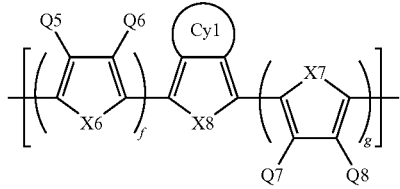

wherein:
X1 to X8 are the same as or different from each other, and are each independently selected from a group consisting of CRR', NR, O, SiRR', PR, S, GeRR', Se, and Te;
Y1 to Y4 are the same as or different from each other, and are each independently selected from a group consisting of CR'', N, SiR'', P, and GeR'';
Cy1 is a substituted or unsubstituted hydrocarbon ring or a substituted or unsubstituted hetero ring;
R, R', R'', Q1 to Q8, R1 to R4, R10, and R11 are the same as or different from each other, and are each independently hydrogen, deuterium, a halogen group, a nitrile group, a nitro group, an imide group, an amide group, a hydroxy group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted amine group, a substituted or unsubstituted aryl group, or a substituted or unsubstituted heterocyclic group;
R20 and R21 are the same as or different from each other, and are each independently a substituted or unsubstituted alkoxy group or a substituted or unsubstituted aryloxy group;
a, b, d, e, f, and g are each an integer of 0 to 3;
when a, b, d, e, f, and g are each 2 or more, two or more structures in the parenthesis are the same as or different from each other; and
A1 and A2 are the same as or different from each other, and are each independently fluorine or chlorine.

2. The polymer of claim 1, wherein the second unit represented by Chemical Formula 2 is represented by the following Chemical Formula 2-1:

[Chemical Formula 2-1]

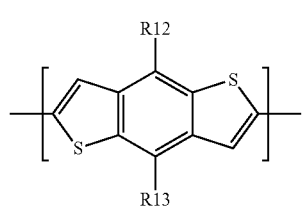

wherein R12 and R13 are the same as or different from each other, and are each independently a substituted or unsubstituted alkyl group, a substituted or unsubstituted alkoxy group, a substituted or unsubstituted aryl group, or a substituted or unsubstituted heterocyclic group.

3. The polymer of claim 1, wherein the third unit is represented by Chemical Formula 3-1 or Chemical Formula 3-2:

[Chemical Formula 3-1]

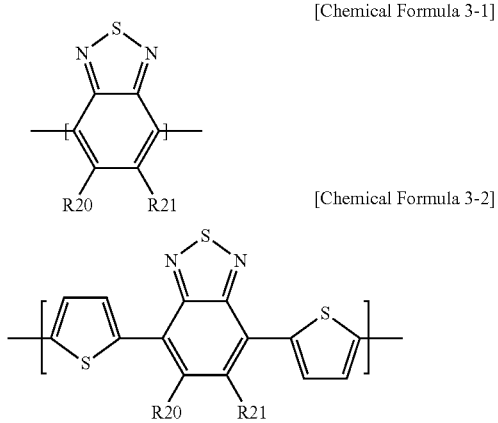

[Chemical Formula 3-2]

wherein R20 and R21 are the same as those defined in Chemical Formula 3.

4. The polymer of claim 1, wherein the polymer comprises a unit represented by the following Chemical Formula 5 or the following Chemical Formula 6:

[Chemical Formula 5]

[Chemical Formula 6]

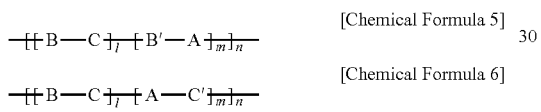

wherein:
l is a molar ratio and a real number of 0<l<1;
m is a molar ratio and a real number of 0<m<1;
l+m=1;
A is the first unit represented by Chemical Formula 1;
B and B' are the same as or different from each other, and are each independently the second unit represented by Chemical Formula 2;

C and C' are the same as or different from each other, and are each independently the third unit represented by Chemical Formula 3 or Chemical Formula 4; and
n is a repeating number of the unit and an integer of 1 to 10,000.

5. The polymer of claim 4, wherein B of Chemical Formula 5 is the second unit represented by the following Chemical Formula 2-1, and
a and b are 0:

[Chemical Formula 2-1]

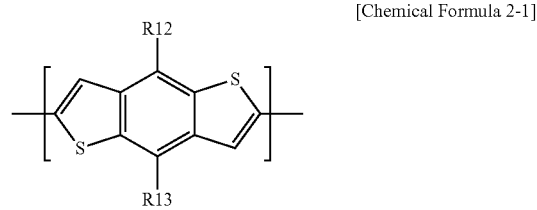

wherein R12 and R13 are the same as or different from each other, and are each independently a substituted or unsubstituted alkyl group, a substituted or unsubstituted alkoxy group, a substituted or unsubstituted aryl group, or a substituted or unsubstituted heterocyclic group.

6. The polymer of claim 4, wherein C of Chemical Formula 6 is the third unit represented by the following Chemical Formula 3-1, and
a and b are each an integer of 1 to 3,

[Chemical Formula 3-1]

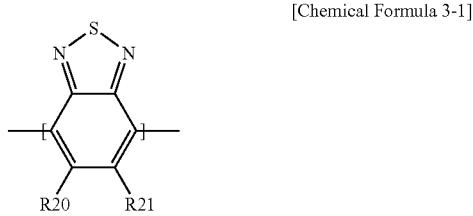

wherein R20 and R21 are the same as those defined in Chemical Formula.

7. The polymer of claim 1, wherein the polymer comprises a unit represented by any one of the following Chemical Formulae 7, 8, and 11:

[Chemical Formula 7]

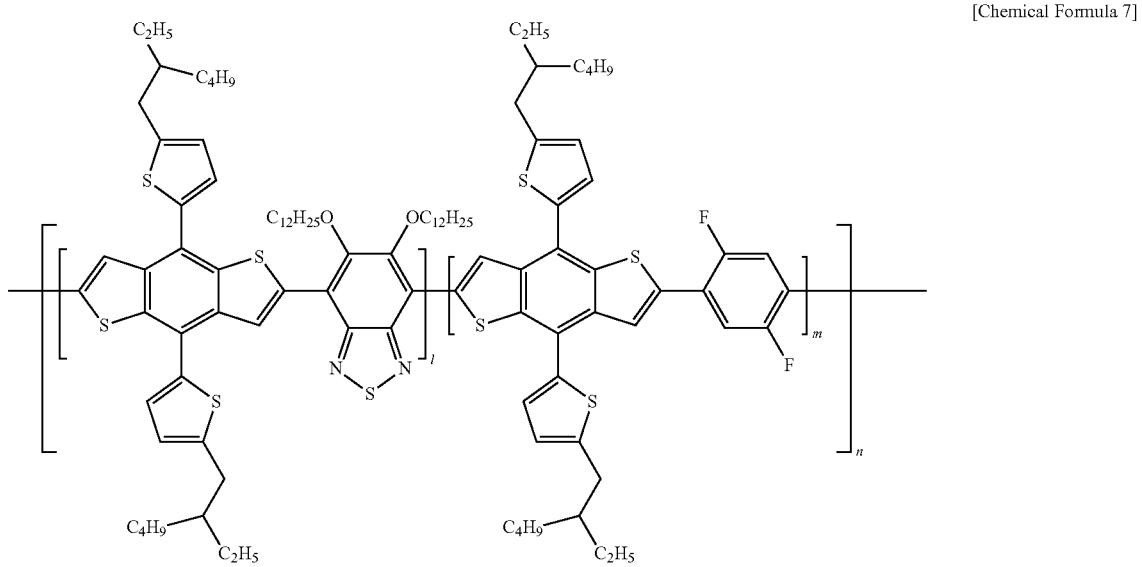

[Chemical Formula 8]

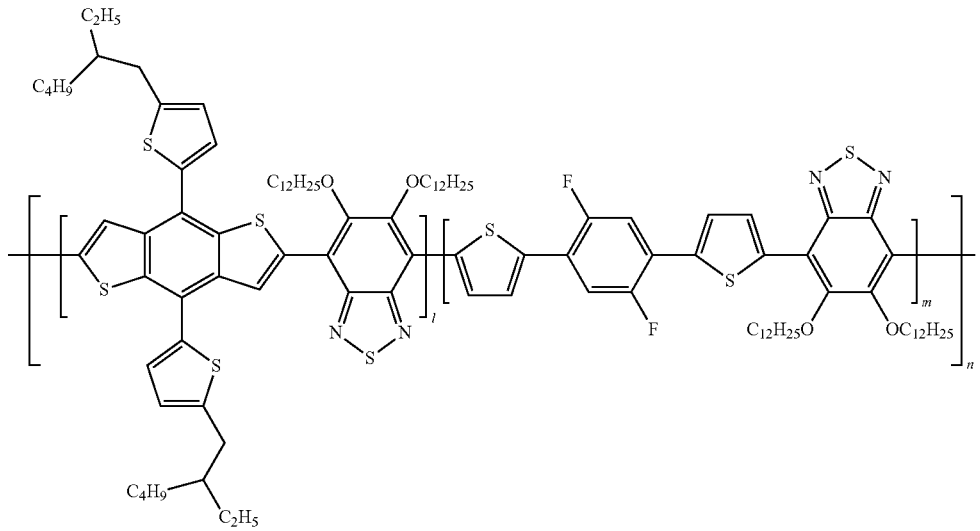

[Chemical Formula 11]

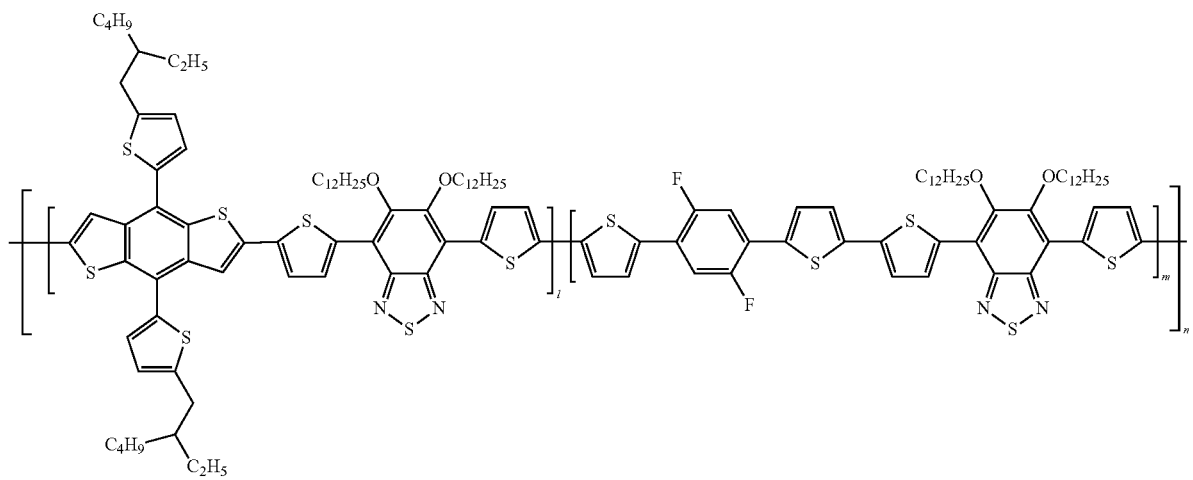

wherein:
l is a molar ratio and a real number of 0<l<1;
m is a molar ratio and a real number of 0<m<1;
l+m=1; and
n is a repeating number of the unit and an integer of 1 to 10,000.

8. The polymer of claim 1, wherein the polymer is a random polymer.

9. The polymer of claim 1, wherein the polymer has a number average molecular weight of 5,000 g/mol to 1,000,000 g/mol.

10. The polymer of claim 1, wherein the polymer has a molecular weight distribution of 1 to 10.

11. An organic solar cell comprising:
a first electrode;
a second electrode on the first electrode; and
one or more organic material layers between the first electrode and the second electrode and comprising a photoactive layer,
wherein the one or more organic material layers comprise the polymer of claim 1.

12. The organic solar cell of claim 11, wherein the photoactive layer comprises one or two or more selected from a group consisting of an electron donor and an electron acceptor, and
the electron donor comprises the polymer.

13. The organic solar cell of claim 12, wherein the electron donor and the electron acceptor constitute a bulk heterojunction (BHJ).

14. The organic solar cell of claim 11, wherein the photoactive layer has a bilayer thin film structure comprising an n-type organic material layer and a p-type organic material layer, and
the p-type organic material layer comprises the polymer.

15. The polymer of claim 1, wherein the third unit is a unit of Chemical Formula 3-3:

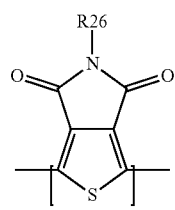

[Chemical Formula 3-3]

wherein R26 is hydrogen, a halogen group, a substituted or unsubstituted alkyl group, a substituted or unsubstituted alkoxy group, a substituted or unsubstituted aryl group, or a substituted or unsubstituted heterocyclic group.

16. The polymer of claim 4, wherein the polymer comprises the unit of Chemical Formula 6, and C is the third unit of Chemical Formula 3-3, and a and b are each an integer of 1 to 3,

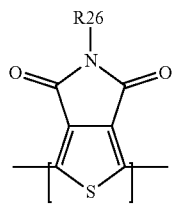

[Chemical Formula 3-3]

wherein R26 is hydrogen, a halogen group, a substituted or unsubstituted alkyl group, a substituted or unsubstituted alkoxy group, a substituted or unsubstituted aryl group, or a substituted or unsubstituted heterocyclic group.

17. The polymer of claim 1, wherein the polymer comprises a unit of Chemical Formula 9 or Chemical Formula 10:

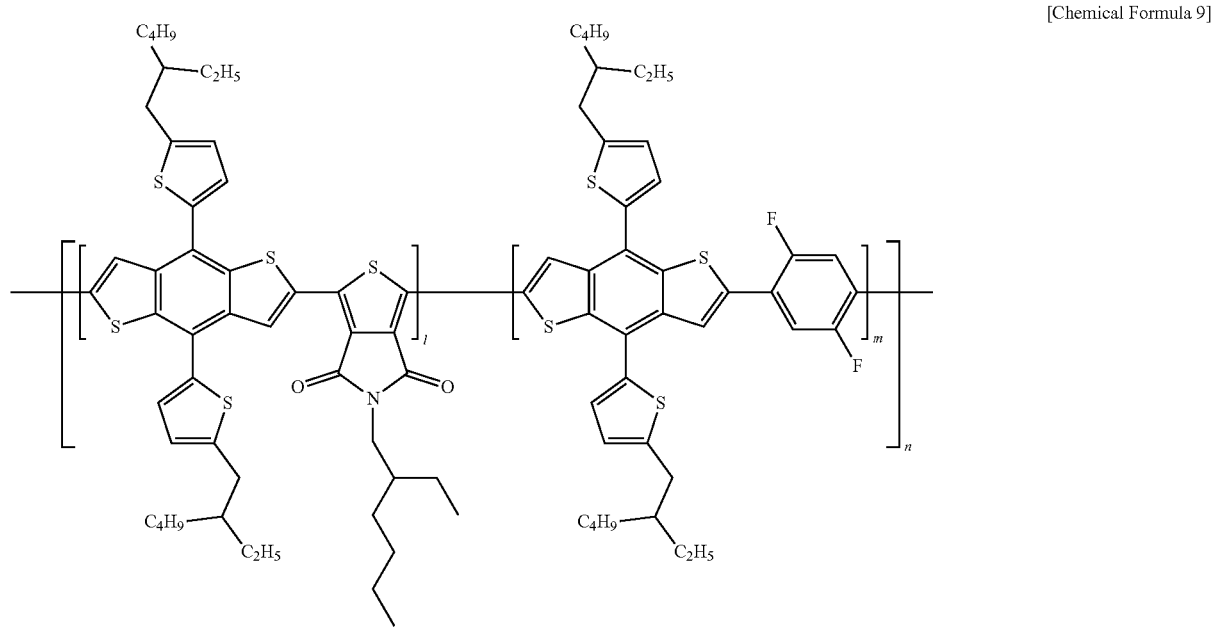

[Chemical Formula 9]

-continued
[Chemical Formula 10]
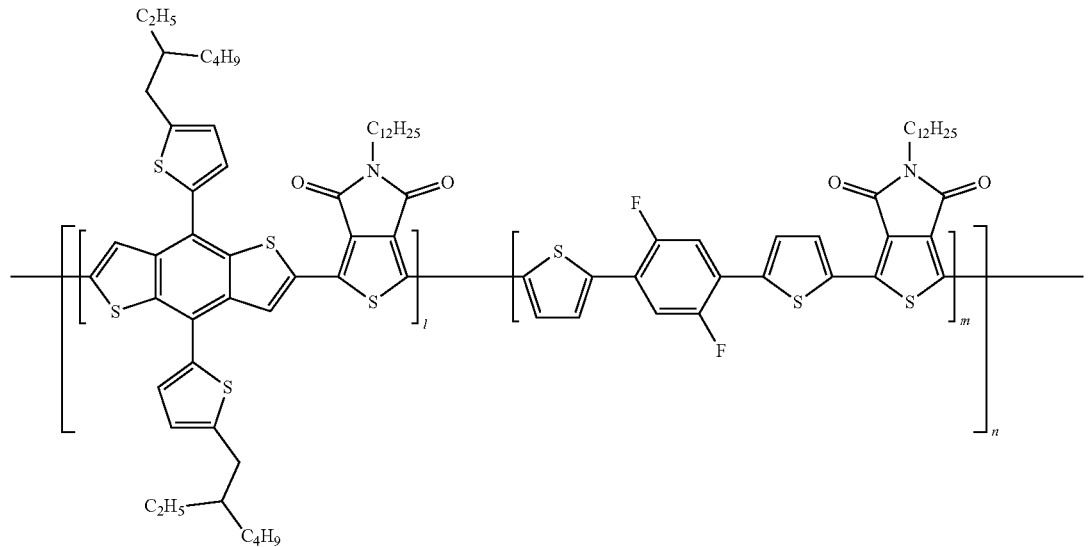
wherein:
l is a molar ratio and a real number of 0<l<1;
m is a molar ratio and a real number of 0<m<1;
l+m=1; and
n is a repeating number of the unit and an integer of 1 to 10,000.
* * * * *

UNITED STATES PATENT AND TRADEMARK OFFICE
CERTIFICATE OF CORRECTION

PATENT NO. : 10,644,241 B2
APPLICATION NO. : 15/535600
DATED : May 5, 2020
INVENTOR(S) : Lee et al.

Page 1 of 1

It is certified that error appears in the above-identified patent and that said Letters Patent is hereby corrected as shown below:

In the Claims

Column 50, Line 39, Claim 6:
Please correct "Chemical Formula." to read -- Chemical Formula 3. --

Signed and Sealed this
Twenty-second Day of September, 2020

Andrei Iancu
*Director of the United States Patent and Trademark Office*